(12) United States Patent
Lee et al.

(10) Patent No.: US 9,929,100 B2
(45) Date of Patent: Mar. 27, 2018

(54) ELECTRONIC COMPONENT PACKAGE AND METHOD OF MANUFACTURING THE SAME

(71) Applicant: SAMSUNG ELECTRO-MECHANICS CO., LTD., Suwon-si (KR)

(72) Inventors: Doo Hwan Lee, Suwon-si (KR); Hyoung Joon Kim, Suwon-si (KR); Jong Rip Kim, Suwon-si (KR); Kyung Seob Oh, Suwon-si (KR); Ung Hui Shin, Suwon-si (KR)

(73) Assignee: SAMSUNG ELECTRO-MECHANICS CO., LTD., Gyeonggi-Do, Suwon-si (KR)

( * ) Notice: Subject to any disclaimer, the term of this patent is extended or adjusted under 35 U.S.C. 154(b) by 0 days.

(21) Appl. No.: 15/076,174

(22) Filed: Mar. 21, 2016

(65) Prior Publication Data

US 2016/0307847 A1 Oct. 20, 2016

(30) Foreign Application Priority Data

Apr. 17, 2015 (KR) .......................... 10-2015-0054778
Jul. 14, 2015 (KR) .......................... 10-2015-0100035

(51) Int. Cl.
*H01L 23/538* (2006.01)
*H01L 23/544* (2006.01)
(Continued)

(52) U.S. Cl.
CPC .......... *H01L 23/5389* (2013.01); *H01L 23/13* (2013.01); *H01L 23/49827* (2013.01);
(Continued)

(58) Field of Classification Search
None
See application file for complete search history.

(56) References Cited

U.S. PATENT DOCUMENTS 6,239,482 B1 5/2001 Fillion et al.
8,354,304 B2 1/2013 Chow et al.
(Continued)

FOREIGN PATENT DOCUMENTS

KR 10-0821154 B1 4/2008
KR 10-1362714 B1 2/2014
WO WO 2009/118950 A1 10/2009

OTHER PUBLICATIONS

Farrens, S., et al., "Permanent Bonding with Polymers" ECS Transactions 16(8), 2008, pp. 141-146.*
(Continued)

*Primary Examiner* — Erik Kielin
(74) *Attorney, Agent, or Firm* — McDermott Will & Emery LLP

(57) ABSTRACT

An electronic component package and a method of manufacturing an electronic component package are provided. An electronic component package includes a frame having a cavity, an electronic component disposed in the cavity, a redistribution layer disposed adjacent to the frame and electrically connected to the electronic component, and an encapsulation material encapsulating the electronic component and having an elastic modulus smaller than that of a material constituting the frame.

22 Claims, 19 Drawing Sheets

(51) Int. Cl.
  *H01L 23/498* (2006.01)
  *H01L 23/13* (2006.01)
  *H01L 23/00* (2006.01)
  *H01L 23/31* (2006.01)
  *H01L 23/10* (2006.01)
  *H01L 25/10* (2006.01)
  *H01L 21/56* (2006.01)

(52) U.S. Cl.
  CPC ........ *H01L 23/5384* (2013.01); *H01L 23/544* (2013.01); *H01L 24/19* (2013.01); *H01L 24/20* (2013.01); *H01L 24/96* (2013.01); H01L 21/568 (2013.01); H01L 23/3128 (2013.01); H01L 23/49811 (2013.01); H01L 23/5386 (2013.01); H01L 25/105 (2013.01); H01L 2223/54426 (2013.01); H01L 2223/54486 (2013.01); H01L 2224/04105 (2013.01); H01L 2224/12105 (2013.01); H01L 2224/24227 (2013.01); H01L 2225/1035 (2013.01); H01L 2225/1041 (2013.01); H01L 2225/1058 (2013.01); H01L 2924/3025 (2013.01); H01L 2924/3511 (2013.01)

(56) References Cited

U.S. PATENT DOCUMENTS 8,497,587 B2    7/2013  Ma
2002/0066955 A1*  6/2002  Shibamoto ............... H01L 23/13
                                                257/720
2003/0062541 A1*  4/2003  Warner ................ H01F 17/0033
                                                257/200
2005/0133929 A1*  6/2005  Howard ............... H01L 23/5385
                                                257/774
2005/0202590 A1*  9/2005  Huang ................ H01L 21/6835
                                                438/106
2009/0244865 A1   10/2009  Tanaka
2010/0112321 A1*  5/2010  Zhu ....................... B29C 70/025
                                                428/220
2010/0301474 A1* 12/2010  Yang .................. H01L 23/5389
                                                257/737
2012/0119391 A1*  5/2012  Koizumi ............... H01L 21/561
                                                257/782
2013/0003319 A1   1/2013  Malatkar et al.
2013/0249075 A1   9/2013  Tateiwa et al.
2014/0048906 A1*  2/2014  Shim ..................... H01L 23/481
                                                257/531
2014/0070396 A1*  3/2014  Kyozuka ................ H01L 24/19
                                                257/698
2017/0055339 A1*  2/2017  Zhang ................ H05K 1/0204

OTHER PUBLICATIONS

Office Action issued in corresponding Taiwanese Patent Application No. 105109169, dated Dec. 27, 2017, with English Translation.

* cited by examiner

III-III'

ELECTRONIC COMPONENT PACKAGE AND METHOD OF MANUFACTURING THE SAME

CROSS-REFERENCE TO RELATED APPLICATION

This application claims the benefit under 35 USC 119(a) of Korean Patent Application No. 10-2015-0054778 filed on Apr. 17, 2015 and Korean Patent Application No. 10-2015-0100035 filed on Jul. 14, 2015, in the Korean Intellectual Property Office, the entire disclosure of both of which are incorporated herein by reference for all purposes.

BACKGROUND

1. Field

The following description relates to an electronic component package and a method of manufacturing the same.

2. Description of Related Art

An electronic component package is defined as a package technology for electrically connecting an electronic component to a printed circuit board (PCB), such as a main board of an electronic device, and protecting the electronic component from external impact. One of the main recent trends of developing technology associated with electronic components is to reduce component size. Therefore, in a package field, in order to produce a compact electronic component, a package having a large number of pins while having a compact size has become desirable.

One package technology suggested in order to satisfy the technical requirements as described above is wafer level package (WLP) technology using redistribution of an electrode pad of an electronic component formed on a wafer. A wafer level package (WLP) may be a fan-in wafer level package (fan-in WLP) or a fan-out wafer level package (fan-out WLP). Among these packages, the fan-out WLP may be useful for implementing a number of pins while having a compact size.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic component package includes a frame having a cavity, an electronic component disposed in the cavity, a redistribution layer disposed adjacent to the frame and electrically connected to the electronic component, and an encapsulation material encapsulating the electronic component and having an elastic modulus smaller than that of a material constituting the frame.

The cavity may penetrate a first surface of the frame and a second surface of the frame opposing the first surface.

An area ratio ($S_a/S_t*100$) occupied by the electronic component may be more than 15%, in which an entire area of the electronic component package is defined as $S_t$, and an area of the electronic component is defined as $S_a$, in the same plane.

The elastic modulus of the encapsulation material may be 15 GPa or less.

The elastic modulus of the material constituting the frame may be 20 GPa or more.

The number of electronic components may be plural, and the plurality of electronic components may be disposed in the cavity of the frame.

The number of cavities of the frame may be plural, and electronic components may be disposed in the plurality of cavities of the frame, respectively.

At one of the plurality of electronic components may be an integrated circuit chip.

An effective insulation thickness of the redistribution layer may be defined as $L_1$ and a thickness from a lower surface of the electronic component to an outer surface of the encapsulation material in the same cross section may be defined as $L_2$ so that $L_1/L_2$ satisfies $L_1/L_2 \le 1/10$.

The encapsulation material may fill a space between the frame and the electronic component in the cavity and may cover the electronic component.

An elongation of the encapsulation material may be 1.2% or more.

The general aspect of the electronic component package may further include an external layer connected to the redistribution layer and having first openings, and first external connection terminals disposed in the first openings and exposed externally. At least one of the first external connection terminals may be disposed in a fan-out region.

The general aspect of the electronic component package may further include a penetration wiring penetrating the frame and electrically connected to the redistribution layer.

The general aspect of the electronic component package may further include a first pad disposed on the first surface of the frame and connected to the penetration wiring, and a second pad disposed on the second surface of the frame and connected to the penetration wiring.

The general aspect of the electronic component package may further include a metal layer disposed on at least one of the first and second surfaces of the frame and an inner surface of the cavity.

In another general aspect, a method of manufacturing an electronic component package involves preparing a frame having a cavity, disposing an electronic component in the cavity, encapsulating the electronic component using an encapsulation material having an elastic modulus smaller than that of a material constituting the frame, and forming a redistribution layer electrically connected to the electronic component to be adjacent to the second surface of the frame.

The disposing of the electronic component in the cavity may involve positioning the frame and the electronic component on an adhesive layer.

The general aspect of the method of manufacturing an electronic component package may further involve removing an adhesive layer used to support the frame and the electronic component during the encapsulating of the electronic component prior to the forming of the redistribution layer.

In another general aspect, an electronic component package includes an electronic component and a frame disposed on a redistribution layer, the electronic component electrically connected to the redistribution layer, and the frame including an insulating material, and an encapsulation material covering the electronic component, an elastic modulus of the encapsulation material being smaller than an elastic modulus of the insulating material of the frame.

The elastic modulus of the encapsulation material may be approximately 50 MPa or greater to 15 GPa or less, and the elastic modulus of the insulating material of the frame may be approximately 20 GPa or greater.

Other features and aspects will be apparent from the following detailed description, the drawings, and the claims.

Figure 1:
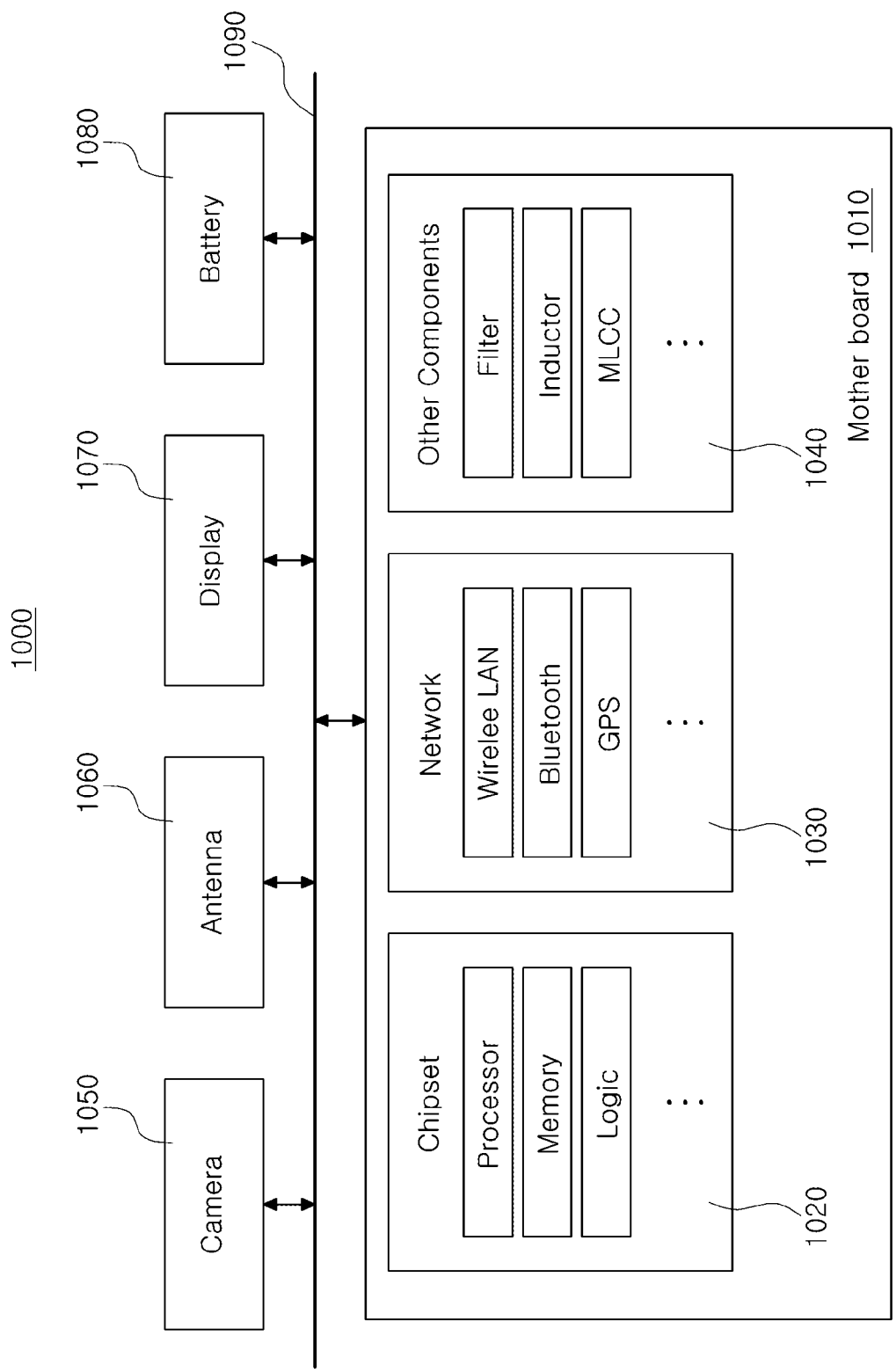
FIG. 1 is a block diagram schematically illustrating an embodiment of an electronic device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the description, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on an orientation of the figures. The device may be otherwise oriented (rotated 90 degrees or at other orientations) and the spatially relative descriptors used herein may be interpreted accordingly.

The terminology used herein is for describing embodiments and is not intended to be limiting of the present description. As used herein, the singular forms "a," "an," and "the" are intended to include the plural forms as well, unless the context clearly indicates otherwise. It will be further understood that the terms "comprises," and/or "comprising" when used in this description, specify the presence of stated features, integers, steps, operations, members, elements, and/or groups thereof, but do not preclude the presence or addition of one or more other features, integers, steps, operations, members, elements, and/or groups thereof.

As noted above, warpage may occur in electronic components due to various causes. When a wafer level package, or the like, is manufactured by encapsulating the electronic components using a general encapsulation material, warpage of the electronic components may be expanded to the entire package.

According to an example of the present description, the occurrence of warpage is prevented or reduced in an electronic component package. According to another example, an efficient method of manufacturing such an electronic component package is provided. According to an example, a package is supported using a frame having a relatively large elastic modulus, and an electronic component is encapsulated using an encapsulation material having a relatively small elastic modulus to relax stress of the electronic component.

Hereinafter, various embodiments of the present description will be described with reference to schematic views. In the drawings, for example, due to manufacturing techniques and/or tolerances, modifications of the shape shown may be estimated. Thus, embodiments of the present description should not be construed as being limited to the shapes of regions shown herein, for example, to include a change in shape results in manufacturing. The following embodiments may also be constituted by one or a combination thereof.

The contents of the present description described below may have a variety of configurations and propose only a required configuration herein, but are not limited thereto.

Warpage may occur in electronic components due to various causes. When a wafer level package, or the like, is manufactured by encapsulating the electronic components using a general encapsulation material, warpage of the electronic components may be expanded to the entire package.

According to an example of the present description, the occurrence of warpage is prevented or reduced in an electronic component package. According to another example, an efficient method of manufacturing such an electronic component package is provided. According to an example, a package is supported using a frame having a relatively large elastic modulus, and an electronic component is encapsulated using an encapsulation material having a relatively small elastic modulus to relax stress of the electronic component.

Electronic Device

FIG. 1 illustrates an embodiment of an electronic device. Referring to FIG. 1, an electronic device 1000 accommodates a main board 1010. Chip-related components 1020, network-related components 1030, and other components 1040 may be physically and/or electrically connected to the main board 1010. There, components may be coupled to other components, thereby forming various signal lines 1090.

As the chip-related component 1020, a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a micro processor, a micro controller, or the like; a logic chip such as an analog-digital converter, an application-specific integrated circuit (ASIC), or the like, may be included, but the chip-related component 1020 is not limited thereto. In addition to the above-mentioned components, chip-related components 1020 in different forms may also be included. Further, these components 1020 may be combined with each other.

As the network-related component 1030, any of wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+(HSDPA+), high speed uplink packet access+(HSUPA+), enhanced data GSM environment (EDGE), global system for mobile communications (GSM), global positioning system (GPS), general package radio service (GPRS), code division multiplex access (CDMA), time division multiple access (TDMA), digital cordless telephone (DECT), Bluetooth, 3G, 4G, 5G protocols, and any other wireless and wired protocols designated after the above-mentioned protocols may be included, but the network-related component 1030 is not limited thereto. In addition to the above-mentioned components, any one of various other wireless or wired standards or protocols may also be included. Further, these components 1030 may be combined with the chip-related components 1020 described above.

Other components 1040 may include a high-frequency inductor, a ferrite inductor, a power inductor, ferrite beads, low-temperature co-firing ceramics (LTCC), an electromagnetic interference (EMI) filter, a multilayer ceramic condenser (MLCC), or the like, but are not limited thereto. In addition to the above-mentioned components, other passive elements used for various purposes may be included. Further, these components 1040 may be combined with the above-mentioned chip-related components 1020 and/or the above-mentioned network-related components 1030.

The electronic device 1000 may include another component which may or may not be physically and/or electrically connected to the main board 1010 depending on the kind of electronic device 1000. Examples of other components that may be included in the electronic device 1000 are a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (for example, a hard disk drive) (not illustrated), a compact disk (CD, not illustrated), a digital versatile disk (DVD, not illustrated), and the like, but are not limited thereto. In addition to the above-mentioned components, other components used for various purposes may be included depending on the kind of electronic device 1000.

The electronic device 1000 may be a smartphone, a personal digital assistant, a digital video camera, a digital still camera, a network system, a computer, a monitor, a tablet, a laptop, a netbook, a television, a video game console, a smart watch, or the like. However, the electronic device 1000 is not limited thereto, and may be any other electronic device processing data as well as the above-mentioned electronic devices.

Figure 2:
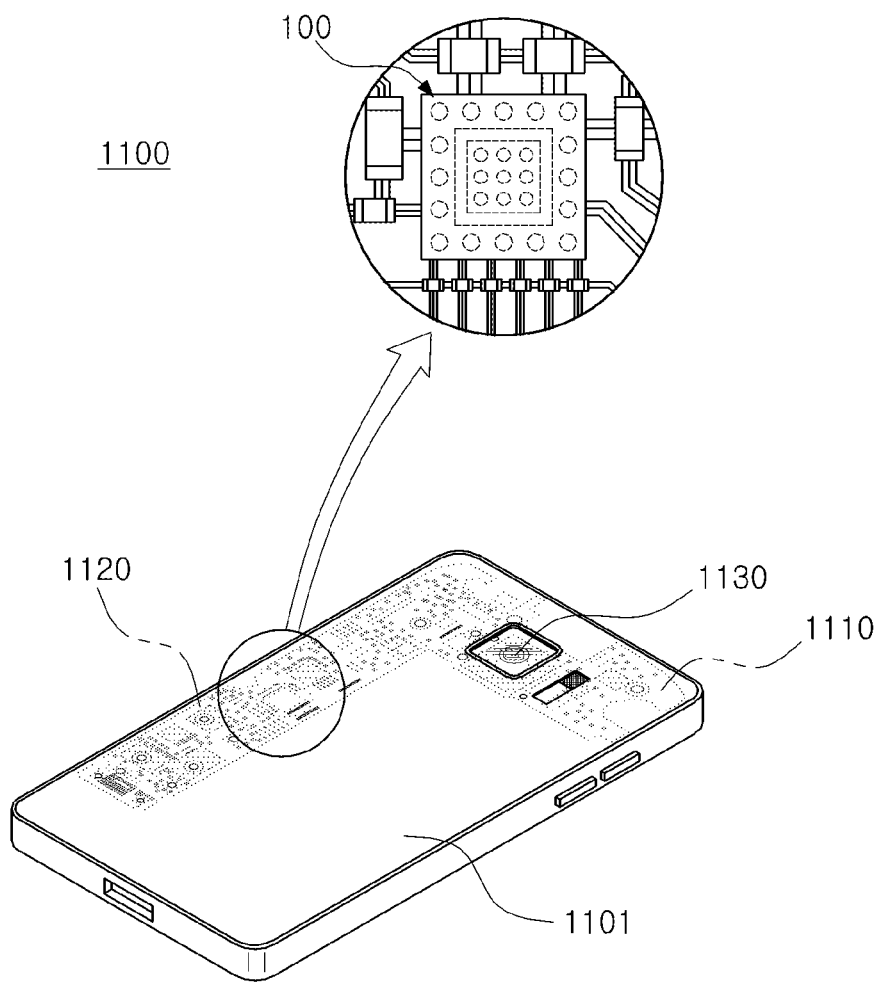
FIG. 2 is a perspective diagram schematically illustrating an embodiment of an electronic component package applied to an electronic device.

FIG. 2 schematically illustrates an embodiment of an electronic component package applied to an electronic device. The electronic component package may be applied to various electronic devices 1000 as described above for various purposes. For example, as illustrated in FIG. 2, a main board 1110 may be accommodated in a body 1101 of a smartphone 1100, and various electronic components 1120 may be physically and/or electrically connected to the main board 1110. Further, another component, such as a camera 1130, which may or may not be physically and/or electrically connected to the main board 1110, may be accommodated in the body 1101. In this case, some of the electronic components 1120 may be the chip-related components as described above, and among them, the electronic component package 100 may be, for example, an application processor, but is not limited thereto.

Electronic Component Package

Figure 3:
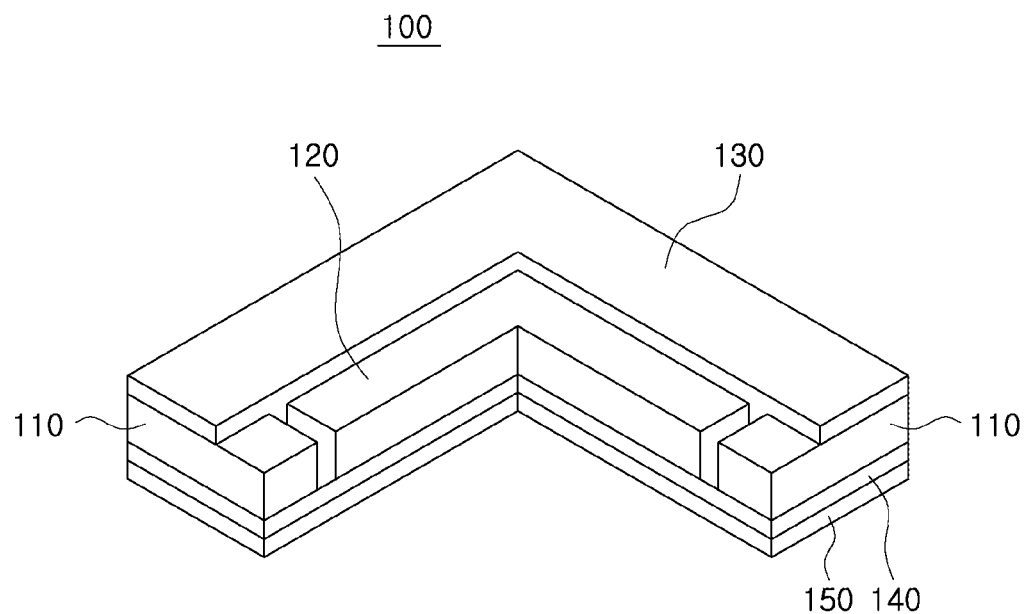
FIG. 3 is a perspective diagram schematically illustrating an embodiment of the electronic component package.

FIG. 3 illustrates a perspective view of an embodiment of the electronic component package.

Figure 4:
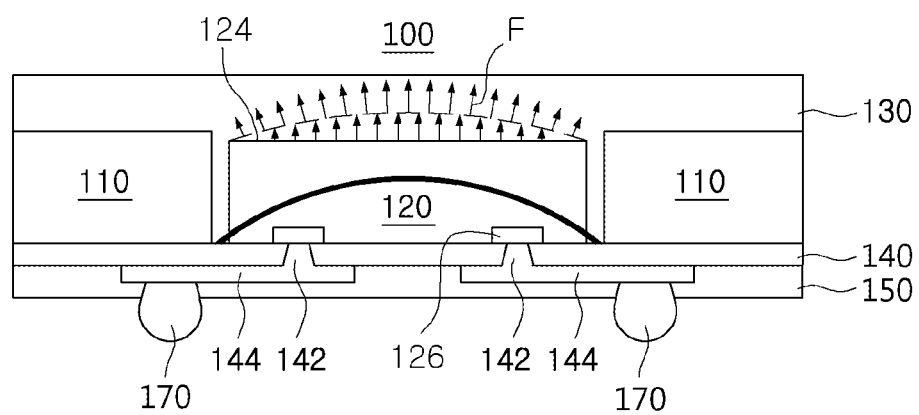
FIG. 4 is a cross-sectional diagram schematically illustrating an embodiment of the electronic component package.

FIG. 4 illustrates a cross-sectional view of an embodiment of the electronic component package.

Generally, an electronic component 120 in the electronic component package 100 may be implemented as an integrated circuit (IC) chip in which at least several hundred to several millions or more of various elements are integrated with each other. Referring to FIGS. 3 and 4, in an integrated circuit chip, a passivation (PSV) material (not illustrated) may be positioned around an electrode pad 126, but in view of physical properties such as coefficient of thermal expansion, elastic modulus, or the like, the passivation material may be significantly different from silicon (Si), germanium (Ge), gallium arsenide (GaAs), or the like, which are used as a base material. Therefore, even though a rear side 124 of an element is only ground, warpage may occur due to stress F of the electronic component. In a case of encapsulating this electronic component 120 using a general encapsulation material to manufacture the electronic component package 100, warpage of the electronic component 120 may be expanded to the entire package, and thus warpage of the package itself may occur. In addition, when the electronic component 120 is exposed to a severe condition such as a high temperature, or the like, in a package state, a warpage may occur for a similar reason.

Conversely, in a case of encapsulating the electronic component 120 using an encapsulation material 130 having a relatively small elastic modulus in the electronic component package 100, the encapsulation material 130 may be easily deformed due to the small elastic modulus, and thus stress F acting on the electronic component 120 may be dispersed and relaxed (as illustrated by the arrows). As a result, warpage expanded to the package may be decreased. At the same time, in a case of supporting the package using a frame 110 that is not easily deformed due to a relatively large elastic modulus, warpage of the package may be further decreased.

Further, in the electronic component package 100, in a case of filling a space between the frame 110 and the electronic component 120 in a cavity 110X of the frame 110 using the encapsulation material 130 having a relatively small elastic modulus, the electronic component 120 may be plane-fixed to a wall surface of the frame 110 and decrease bulking of the electronic component 120 due to a stress relaxation effect.

Meanwhile, when an entire area of the electronic component package 100 on a plane is defined as $S_t$, and an area of the electronic component 120 on the plane is defined as $S_a$, an area ratio ($S_a/S_t*100$) occupied by the electronic component 120 may be more than 15%, for example, about 30% to 90%. To miniaturize a package, for example, as in a chip scale package (CSP), or the like, the area ratio occupied by the electronic component 120 may be significant. In the event that the area ratio occupied by the electronic component 120 is more than about 15%, because the electronic component 120 significantly affects the entire package, the warpage of the electronic component 120 is expanded to the entire package as described above. However, in a case of using the above-mentioned encapsulation material 130 having a relatively small elastic modulus and the frame 110 having a relatively large elastic modulus, even if the area ratio occupied by the electronic component 120 is more than 15%, a warpage may be prevented.

Meanwhile, when an effective insulation thickness of a redistribution layer 140, 142, 144 in a cross section is defined as $L_1$ and a thickness from a lower surface 122 of the electronic component 120 to an outer surface of the encapsulation material 130 in the cross section is defined as $L_2$, $L_1/L_2$ may satisfy $L_1/L_2 \leq 1/10$. Here, the effective insulation thickness may be defined as a substantial insulation thickness of the redistribution layer 140, 142, 144. According to one example, the redistribution layer 140, 142, 144 is a multi-layered structure including a set of layers 140, 142, 144. For example, according to one example, a single redistribution layer may be provided in the electronic component package 100. The single redistribution layer may include only one set of a conductive via 142, and a thickness of an insulating layer 140 may be the effective insulation thickness. In an example in which a plurality of redistribution layers are provided as the redistribution structure of the electronic component package 100, the effective insulation thickness may be a sum of thicknesses obtained by subtracting the thickness of a conductive pattern 144 from the thickness of the corresponding insulating layer 140 of each of the redistribution layers. In general, it is known that stress is in proportion to a cube of a thickness. Therefore, by significantly reducing a thickness of the redistribution layer 140, 142, 144 provided in the electronic component package 100, stress generated in the corresponding layer may be avoided. Stress may also be generated in the redistribution layer 140, 142, 144 due to curing shrinkage of the insulating layer 140. However, in the event that the effective insulation thickness is sufficiently reduced, the stress may be avoided. That is, in the event that the effective insulation thickness of the redistribution layer 140, 142, 144 is equal to or less than $1/10$ of a thickness of the remaining portion of the package (except for an external layer), which is sufficiently thin, warpage caused by stress generated in the redistribution layer 140, 142, 144 may be avoided. Since stress caused by curing shrinkage, or the like, of the encapsulation material 130 may be generated in a direction opposite to a direction of stress generated in the electronic component 120, the stress may be offset by the stress generated in the electronic component 120.

Figure 5:
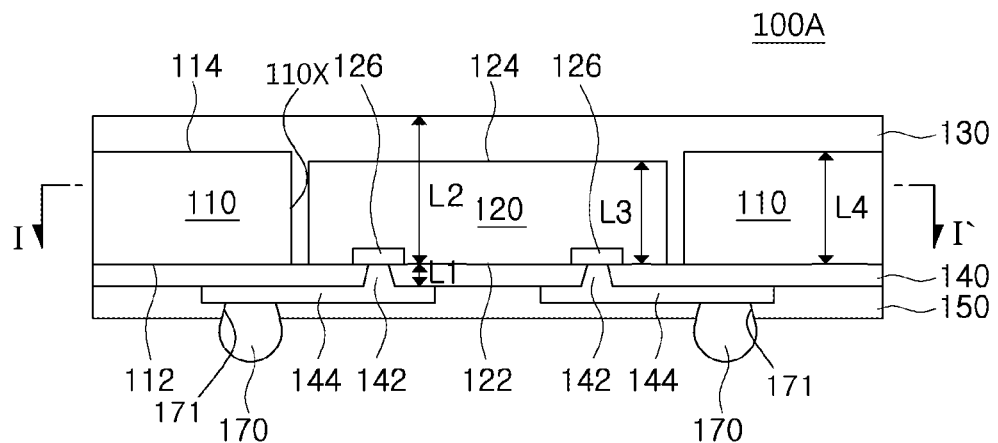
FIG. 5 is a cross-sectional diagram schematically illustrating an embodiment of the electronic component package.

FIG. 5 illustrates a cross-sectional view of an embodiment of the electronic component package.

Figure 6:
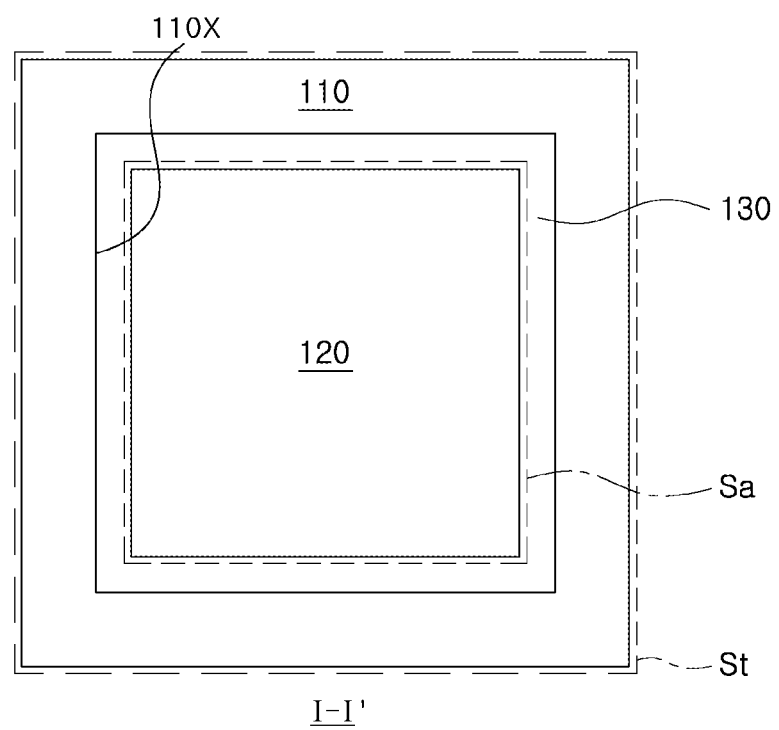
FIG. 6 is a schematic cut-away plan diagram of the electronic component package of FIG. 5 taken along line I-I'.

FIG. 6 illustrates a cut-away plan view of the electronic component package of FIG. 5 taken along line I-I'.

Referring to FIGS. 5 and 6, an electronic component package 100A according to the embodiment includes a frame 110 having first and second surfaces 112 and 114 opposing each other and a cavity 110X penetrating between the first and second surfaces 112 and 114, an electronic component 120 disposed in the cavity 110X of the frame 110, a redistribution layer 140, 142, 144 disposed to be adjacent to the first surface 112 of the frame 110 and electrically connected to the electronic component 120, and an encapsulating material 130 encapsulating the electronic component 120 and having an elastic modulus smaller than that of a material constituting the frame 110. Here, the term "disposed to be adjacent" may include a case in which a target component is disposed in a direction toward a component to be a basis but does not directly contact the corresponding component, as well as a case in which the target component directly contacts the corresponding component.

The frame 110 may be configured to support the package; due to the frame 110, the rigidity of the package may be maintained, and the thickness uniformity of the package may be secured. Further, the frame 110 may have the cavity 110X, and the electronic component 120 may be disposed in this cavity 110X. Thus, the electronic component 120 may be adhered to a wall surface. The frame 110 may provide a wider routing area to the package 100A, and thus a degree of freedom in design may be further improved.

The frame 110 may have the first and second surfaces 112 and 114 opposing each other. In this case, the cavity 110X may penetrate between the first and second surfaces 112 and 114. The frame 110 may be an unclad frame, but is not limited thereto. As described below, a metal layer 116 and/or a conductive pattern (not illustrated) may be disposed on the first surface 112 and/or the second surface 114. In addition, as described below, the metal layer 116 may be disposed in an internal surface of the cavity 110X of the frame 110.

As the material of the frame 110, any material may be used as long as it may support the package and have an elastic modulus larger than that of the encapsulation material 130. For example, an insulating material may be used. Here, as the insulating material, a thermosetting resin such as an epoxy resin, a thermoplastic resin such as polyimide, a resin in which a reinforcement material, such as a glass fiber or an inorganic filler, is impregnated in the thermosetting resin and the thermoplastic resin, for example, a prepreg, an Ajinomoto build-up film (ABF), FR-4, a bismaleimide triazine (BT) resin, or the like, may be used. Alternatively, a metal having excellent rigidity and thermal conductivity may be used. In this case, as the metal, an Fe—Ni based alloy may be used. Here, in order to secure adhesive force with an encapsulating material, an interlayer insulating material, or the like, Cu plating may be formed on a surface of the Fe—Ni based alloy. In addition, other glass, ceramic, plastic, or the like, may be used.

The material of the frame 110 may have an elastic modulus of 20 GPa or more, such as 20 GPa to 38 GPa. In a case in which the material of the frame 110 has an elastic modulus of at least 20 GPa or more, the frame 110 may have sufficient rigidity for supporting the package. In a case in which the elastic modulus of the material of the frame 110 is less than 20 GPa, the frame 110 may not sufficiently serve to support the package, and thus the warpage may occur. The elastic modulus may be defined as a ratio of stress to strain, and the elastic modulus may be measured, for example, through a standard tensile test according to JIS C-6481, KS M 3001, KS M 527-3, ASTM D882, or the like.

The material of the frame 110 may have coefficient of thermal expansion of 11 ppm/° C. or less, such as 2 ppm/° C. to 11 ppm/° C. In a case in which the coefficient of thermal expansion of the material of the frame 110 is more than 11 ppm/° C., when the frame 110 is exposed to a severe environment such as a high temperature, a warpage may occur due to the thermal expansion of the frame 110. The coefficient of thermal expansion (CTE) is defined as a coefficient value of thermal expansion measured using a thermo mechanical analyzer (TMA) or dynamic mechanical analyzer (DMA).

A thickness of the frame 110 in a cross section thereof is not particularly limited, and may be designed according to a thickness of the electronic component 120 in a cross section thereof. For example, the thickness of the frame may be about 100 μm to 500 μm.

The electronic components 120 may be various active components (for example, a diode, a vacuum tube, a transistor, or the like) or passive components (for example, an inductor, a condenser, a resistor, or the like). Alternatively, the electronic component 120 may be an integrated circuit (IC) chip in which at least several hundred to several millions or more of elements are integrated with each other in a single chip. If necessary, an electronic component 120 in which an integrated circuit is packaged in a form of a flip-chip may be used. The integrated circuit chip may be, for example, an application process chip such as a central processor (for example, a central processing unit (CPU)), a graphics processor (for example, a graphics processing unit (GPU)), a digital signal processor, a cryptographic processor, a micro processor, a micro controller, or the like, but is not limited thereto. The electronic component 120 may be provided in plural as described below. In this case, the plurality of electronic components may be different kinds of components, such as integrated circuit chips and passive components.

The electronic component 120 may have an electrode pad 126 on the lower surface 122. The electrode pad 126, which is a structure for obtaining an electrical connection with the electronic component 120, may be electrically redistributed by the redistribution layer 140, 142, 144. As a material for forming the electrode pad 126, a conductive material may be mainly used. As the conductive material, for example, copper (Cu), aluminum (Al), silver (Ag), tin (Sn), gold (Au), nickel (Ni), lead (Pb), palladium (Pd), alloys thereof, or the like, may be used, but the conductive material is not limited thereto. Meanwhile, the electrode pad 126 is not only necessarily disposed on a lower surface 122 of the electronic component 120, but may also be disposed on the upper surface 124 thereof in some cases. Alternatively, the electrode pad 126 may be disposed on both of the upper and lower surfaces 122 and 124 of the electronic component 120.

For instance, in an example in which the electronic component 120 is the integrated circuit chip, the electronic component 120 may have a body (its reference numeral is not illustrated), a passivation layer (its reference numeral is not illustrated), and an electrode pad 126. The body may be formed, for example, based on an active wafer. In this case, as a base material, silicon (Si), germanium (Ge), gallium arsenide (GaAs), or the like, may be used. The passivation layer may serve to protect the body externally and be formed of, for example, an oxide film, a nitride film, or the like. Alternatively, the passivation layer may be formed of a double layer of an oxide film and a nitride film. The electrode pad 126 may be formed on the lower surface 122 of the electronic component 120 connected to the redistribution layer 140, 142, 144. Unlike this, the electrode pad 126 may also be formed on the upper surface 124 thereof. The surface on which the electrode pad 126 is formed may become an active layer. Similarly, as a material for forming the electrode pad 126, a conductive material such as copper (Cu), aluminum (Al), silver (Ag), tin (Sn), gold (Au), nickel (Ni), lead (Pb), palladium (Pd), alloys thereof, or the like, may be used, but the material for forming the electrode pad 126 is not limited thereto.

The electronic component 120 may be disposed in the cavity 110X of the frame 110. In this case, the upper surface 124 of the electronic component 120 in a thickness direction of the cross section may not deviate from the upper surface 114 of the frame 110. In a case in which the electronic component 120 is disposed in the cavity 110X of the frame 110 so as not to deviate from the cavity as described above, the electronic component 120 may be more easily adhered to a wall surface, and a uniformity in thickness of the package may be better maintained. For example, when a thickness of the frame 110 in the cross section thereof is defined as $L_4$, and a thickness of the electronic component 120 in the cross section thereof is defined as $L_3$, $L_4$–$L_3$ may satisfy $L_4$–$L_3 \leq 20$ μm.

The thickness of the electronic component 120 in the cross section thereof is not particularly limited, and may be changed depending on the kind of electronic component 120. For example, in a case in which the electronic component 120 is the integrated circuit chip, the thickness of the electronic component 120 may be 100 μm to 480 μm.

The encapsulation material 130 may be configured to protect the electronic component 120. To this end, the encapsulation material 130 may encapsulate the electronic component 120. An encapsulation shape is not particularly limited, but any shape may be used as long as the encapsulation material encloses the electronic component 120. In the electronic component package 100A according to the embodiment, the encapsulation material 130 may cover the electronic component 120 and the frame 110, thereby dispersing and relaxing stress. Further, in the electronic component package 100A according to the embodiment, the encapsulation material 130 may fill a space between the frame 110 and the electronic component 120 in the cavity, thereby decreasing buckling of the electronic component 120 while serving as a latent adhesive. Here, the concept of covering the frame 110 may be the concept including a case in which a separate thin film layer, or the like, is formed on the second surface 114 of the frame 110. For example, a case in which a metal layer, a conductive pattern, or the like, is formed on the second surface 114 of the frame 110 may also be interpreted as that the encapsulation material 130 covers the frame 110.

The encapsulation material 130 may be composed of a plurality of layers formed of a plurality of materials. For example, after a space in the cavity 110X may be filled with a first encapsulation material, the frame 110 and the electronic component 120 may be covered with a second encapsulation material. Alternatively, after covering the frame 110 and the electronic component 120 at a predetermined thickness while filling the space of the cavity 110X using the first encapsulation material, the second encapsulation material may be covered on the first encapsulation material again at a predetermined thickness. Further, the encapsulation material 130 may be applied in various forms.

As the encapsulation material 130, any material may be used without particular limitation as long as it may have an elastic modulus smaller than that of the frame 110 to thereby sufficiently disperse stress of the electronic component 120. For example, as the encapsulation material, an insulating material may be used. Here, as the insulating material, a thermosetting resin such as an epoxy resin, a thermoplastic resin such as polyimide, a resin in which a reinforcement material, such as a glass fiber or an inorganic filler, is impregnated in the thermosetting resin and the thermoplastic resin, for example, a prepreg, ABF, FR-4, a BT resin, a PID (Photo Imagable Dielectric) resin or the like, may be used. Further, an encapsulating material known in the art such as an epoxy molding compound (EMC), or the like, may also be used. However, a material capable of sufficiently dispersing stress of the electronic component 120 due to an elastic modulus smaller than that of the frame 110 may be selected.

The encapsulation material 130 may have an elastic modulus of 15 GPa or less, such as about 50 MPa to 15 GPa. In a case in which the elastic modulus of the encapsulation material 130 is 15 GPa or less, even though an area occupied by the electronic component 120 is large, warpage of the package may be decreased through a sufficient stress dispersion and relaxation effect. In a case in which the elastic modulus of the encapsulation material 130 is more than 15 GPa, there is no significant difference in the elastic modulus between the encapsulation material 130 and the frame 110, and thus the stress dispersion and relaxation effect may not be sufficient. Meanwhile, in a case in which the elastic modulus of the encapsulation material 130 is excessively small, for example, in a case in which the elastic modulus is less than 50 MPa, deformation may be excessive, and thus basic functions of the encapsulation material 130 may not be performed. Similarly, the elastic modulus may be defined as a ratio of stress to strain, and the elastic modulus may be measured, for example, through a standard tensile test according to JIS C-6481, KS M 3001, KS M 527-3, ASTM D882, or the like.

Elongation of the encapsulation material 130 may be 1.2% or more, such as about 1.2% to 15%. In a case in which elongation of the encapsulation material 130 is less than 1.2%, which is not sufficient, cracks may be generated by externally transferred vibrations, or the like, in corners of the upper surface 124 of the electronic component 120 covered by the encapsulation material 130. In a case in which the elongation of the encapsulation material 130 is 1.2% or more, generation of cracks may be prevented. A method of measuring elongation is not particularly limited. For example, the elongation may be measured through a standard tensile test according to JIS C-6481, KS M 3001, KS M 527-3, ASTM D882, or the like.

A thickness from the upper surface 124 of the electronic component 120 to an external surface of the encapsulation material 130 in a cross section of the encapsulation material 130 is not particularly limited, and may be optimized by a person skilled in the art in a range in which the encapsulation material 130 may have the stress relaxation effect as described above. For example, the thickness may be about 15 μm to 150 μm.

An interval between the frame 110 and the electronic component 120 in the cavity 110X filled with the encapsulation material 130 is also is not particularly limited, and may be optimized by a person skilled in the art in a range in which a fixation effect of the electronic component 120 and a buckling decrease effect as described above may be obtained. For example, the interval may be about 10 μm to 150 μm.

The redistribution layer 140, 142, 144 may be configurations for redistribution of the electrode pad 126 of the electronic component 120. Several ten to several hundred electrode pads 120P having various functions may be redistributed through the redistribution layer 140, 142, 144, and physically and/or electrically externally connected in accordance with the functions thereof through a first external connection terminal 170 to be described below. The redistribution layer 140, 142, 144 may be positioned to be adjacent to the first surface 112 of the frame 110, and electrically connected to the electronic component 120. The redistribution layer 140, 142, 144 may be formed of a single redistribution layer or a plurality of redistribution layers. Each of the redistribution layers may include an insulating layer 140, a conductive pattern 144 disposed on the insulating layer 140, and a conductive via 142 penetrating through the insulating layer 140 and electrically connected to the conductive pattern.

A material of the insulating layer 140 is also not particularly limited as long as it is an insulating material, for example, a thermosetting resin such as an epoxy resin, a thermoplastic resin such as polyimide, a resin in which a reinforcement material, such as a glass fiber or an inorganic filler, is impregnated in the thermosetting resin and the thermoplastic resin, for example, a prepreg, an Ajinomoto build-up film (ABF), FR-4, a bismaleimide triazine (BT) resin, or the like. In a case of using a photosensitive insulating material such as a PID resin, the insulating layer 140 may be formed to have a reduced thickness. In this case, a size of the conductive via may be decreased, and thus it may be easy to implement a fine pitch (for example, 30 μm or less).

In a case of selecting a material having an elastic modulus smaller than that of the material of the frame 110 as the material of the insulating layer 140, the insulating layer 140 may have a stress dispersion and relaxation effect. For example, the material of the insulating layer 140 may have an elastic modulus of 5 GPa or less, such as about 1 GPa to 3 GPa. In a case in which the elastic modulus of the insulating layer 140 is 5 GPa or less, the insulating layer may have a sufficient stress dispersion and relaxation effect. In a case in which the elastic modulus of the insulating layer 140 is more than 5 GPa, the stress dispersion and relaxation effect may be insufficient. Similarly, the elastic modulus may be defined as a ratio of stress to strain, and the elastic modulus may be measured, for example, through a standard tensile test according to JIS C-6481, KS M 3001, KS M 527-3, ASTM D882, or the like.

Similarly, the conductive pattern 144 may serve as a redistribution pattern and/or a pad pattern, and as a material for forming the conductive pattern 144, a conductive material such as copper (Cu), aluminum (Al), silver (Ag), tin (Sn), gold (Au), nickel (Ni), lead (Pb), palladium (Pd), an alloy thereof, or the like, may be used. The conductive pattern 144 may perform various functions depending on a design of the corresponding layer. For example, the conductive pattern may perform a role of a ground (GND) pattern, a power (PWR) pattern, a signal (S) pattern, or the like, as a redistribution pattern. Here, the S pattern may include various signal patterns, for example, a data signal pattern, or the like, except for the GND pattern, the PWR pattern, and the like. Further, the conductive pattern may perform a role of a via pad, an external connection terminal pad, or the like, as the pad pattern.

If necessary, a surface treatment layer may be further formed on an exposed portion of the conductive pattern 144. The surface treatment layer is not particularly limited as long as it is known in the art. For example, the surface treatment layer may be formed by electrolytic gold plating, electroless gold plating, organic solderablity preservative (OSP) or electroless tin plating, electroless silver plating, electroless nickel plating/immersion gold plating, direct immersion gold (DIG) plating, hot air solder leveling (HASL), or the like.

The conductive via 142 may electrically connect the conductive pattern 144, the electrode pad 126, and the like, to each other, which are formed on different layers from each other, thereby forming an electric path in the package 100A. As expected, a conductive material such as copper (Cu), aluminum (Al), silver (Ag), tin (Sn), gold (Au), nickel (Ni), lead (Pb), palladium (Pd), alloys thereof, or the like, may be used as a material for forming the conductive via 142. The conductive via 142 may also be completely filled with the conductive material, or the conductive material may be formed on a wall of the via. Further, all shapes known in the art, such as a tapered shape of which a diameter is decreased downwardly, a reversely tapered shape of which a diameter is increased downwardly, a cylindrical shape, and the like, may be applied to the conductive via 142.

A thickness of the redistribution layer 140, 142, 144 in the cross section thereof is not particularly limited, but may be optimized by a person skilled in the art in a range in which warpage may be controlled as described above. For example, in a case in which the redistribution layer 140, 142, 144 is formed of a single redistribution layer, a thickness thereof may be about 7 µm to 20 µm, and in a case in which the redistribution layer 140, 142, 144 is formed of a plurality of redistribution layers, whenever the redistribution layer is added, a thickness may be increased by about 15 µm to 40 µm in consideration of a thickness of the conductive pattern 144.

The electronic component package 100A according to the embodiment illustrated in FIG. 5 further includes an external layer 150 connected to the redistribution layer 140, 142, 144. The external layer 150 may be configured to protect the redistribution layer 140, 142, 144 from external physical or chemical damages, or the like. In this example, the external layer 150 has a first opening 171 exposing at least a portion of the conductive pattern 144 constituting the redistribution layer 140, 142, 144. However, the configuration of the external layer 140 is not limited thereto. The first opening 171 of the external layer 150 may partially expose an upper surface of the conductive pattern 144, but may expose a side surface of the conductive pattern 144 as needed.

A material of the external layer 150 is not particularly limited. For example, a solder resist may be used. Further, the same material as that of the insulating layer 140 of the redistribution layer 140, 142, 144, for example, the same PID resin may be used. The external layer 150 may generally be a single layer, but may be configured as a plurality of layers, as needed.

The electronic component package 100A according to the embodiment illustrated in FIG. 5 further includes first external connection terminals 170 externally exposed through a surface of the external layer 150 opposing a surface thereof connected to the redistribution layer 140, 142, 144. The first external connection terminal 170 may be configured to physically and/or electrically connect the electronic component package 100A externally. For example, the electronic component package 100A may be mounted on a main board of an electronic device through the first external connection terminal 170. In this example, the first external connection terminal 170 is disposed in the first opening 171 and connected to the conductive pattern 144 exposed through the first opening 171. Therefore, the first external connection terminal 170 is electrically connected to the electronic component 120.

The first external connection terminal 170 may be formed of a conductive material, such as copper (Cu), aluminum (Al), silver (Ag), tin (Sn), gold (Au), nickel (Ni), lead (Pb), palladium (Pd), solder, or the like. However, these materials are only examples, and the material of the first external connection terminal 170 is not limited thereto. The first external connection terminal 170 may be a land, a ball, a pin, or the like. The first external connection terminal 170 may be formed of a multilayer or a single layer. In a case in which the first external connection terminal 170 is formed of the multilayer, the first external connection terminal 170 may contain a copper pillar and solder, and in a case in which the first external connection terminal 170 is formed of the single layer, the first external connection terminal 170 may contain tin-silver solder or copper. However, these cases are only examples, and the first external connection terminal 170 is not limited thereto.

Some of the first external connection terminals 170 may be disposed in a fan-out region. Here, the fan-out region may be defined as a region deviated from a region in which the electronic component 120 is disposed. That is, the electronic component package 100A according to the embodiment illustrated in FIG. 5 may be a fan-out package. In this case, reliability may be excellent as compared to a fan-in package, a plurality of I/O terminals may be implemented, and 3D interconnection may be easily performed. Further, since the fan-out package may be mounted on an electronic device without a separate board as compared to a ball grid array (BGA) package, a land grid array (LGA) package, or the like, the fan-out package may be manufactured to have a reduced thickness, and price competitiveness may be excellent. Meanwhile, in order to illustrate that the first external connection terminal 170 is disposed in the fan-out region, only the first external connection terminal 170 disposed in the fan-out region is illustrated in FIG. 5, but the first external connection terminal 170 may also be disposed in a fan-in region, or the like.

The number, an interval, and disposition form, and the like, of the first external connection terminal 170 are not particularly limited, but may be sufficiently changed by a person skilled in the art depending on a design. For example, the number of the first external connection terminal 170 may be several tens to several thousands depending on the number of electrode pads 126 of the electronic component 120, but is not limited thereto. The number of the first external connection terminal 170 may be more than or less than the above mentioned range.

FIGS. 7A through 7K illustrate an embodiment of a manufacturing process of the electronic component package of FIG. 5.

Among descriptions of the embodiment of the manufacturing process of the electronic component package 100A, a description overlapping the description of the electronic component package 100A described above will be omitted, and a difference therebetween will mainly be described below.

Figure 7A:
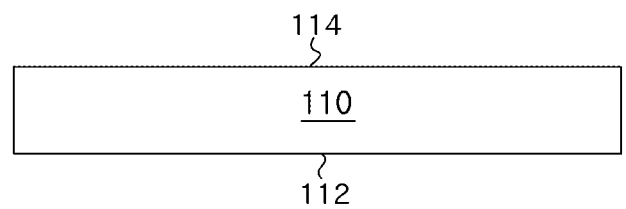
FIGS. 7A through 7K are diagrams schematically illustrating an embodiment of a manufacturing process of the electronic component package of FIG. 5.

Referring to FIG. 7A, a frame 110 is prepared. The frame 110 may be manufactured to have various sizes to thereby be utilized so that mass production may be easily performed. That is, after preparing a large size frame 110, a plurality of electronic component packages 100 may be manufactured through a process to be described below and then singulated by sawing so as to form individual packages. A fiducial mark (not illustrated) for excellent pick-and-place (P&P) may be provided on the frame 110, and thus a position in which an electronic component will be mounted or embedded may be more accurately confirmed, thereby increasing manufacturing completeness. A thin metal film (not illustrated), for example, a copper clad laminate (CCL), or the like, may be formed on first and second surfaces 112 and 114 of the frame 110. In this case, the CCL, or the like, may serve as a basic seed layer for forming a conductive pattern, or the like, in a subsequent process.

Figure 7B:
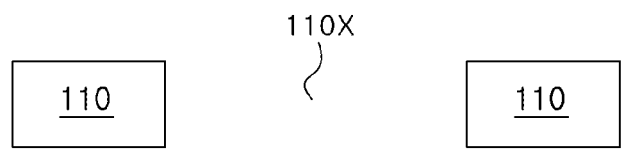

Referring to FIG. 7B, a cavity 110X is formed in the frame 110. A method of forming the cavity 110X in the frame 110 is not particularly limited. For example, the cavity 110X may be formed by a mechanical and/or laser drill, a sand-blast method using polishing particles, a dry etching method using plasma, or the like. Here, the laser drill may be a $CO_2$ laser drill or YAG laser drill, but is not particularly limited thereto. In a case in which the cavity 110X is formed using the mechanical drill and/or laser drill, resin smear in the cavity 110X may be removed by performing desmear treatment. The desmear treatment may be performed, for example, using a permanganate method, or the like. A size or shape of the cavity 110X may be designed to be suitable for a size or shape of an electronic component to be mounted or embedded, and accuracy may be improved by the above-mentioned fiducial mark (not illustrated). Meanwhile, a frame 110 having a cavity 110X may be obtained from the beginning.

Figure 7C:
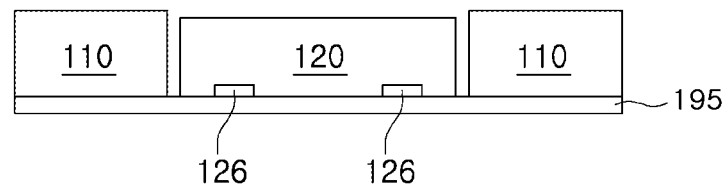

Referring to FIG. 7C, after preparing an adhesive layer 195, the frame 110 and an electronic component 120 to be disposed in the cavity 110X of the frame 110 are attached to one surface of the prepared adhesive layer 195. According to one example, after the frame 110 is attached to the adhesive layer 195 in advance, the electronic component 120 may be attached thereto. In the alternative, after the electronic component 120 is attached to the adhesive layer 195 in advance, the frame 110 may be attached thereto, or the frame 110 and the electronic component 120 may be simultaneously attached. However, when the frame 110 is attached in advance and then the electronic component 120 is attached, excellent accuracy may be obtained. As the adhesive layer 195, any adhesive layer may be used as long as it may fix the frame 110 and the electronic component 120. As a non-restrictive example, a tape known in the art, or the like, may be used. Here, the electronic component 120 may be attached by a face-down method so that an electrode pad 126 may be attached to the adhesive layer 195, which may be useful in manufacturing a wafer level package in a fan-out shape.

Figure 7D:
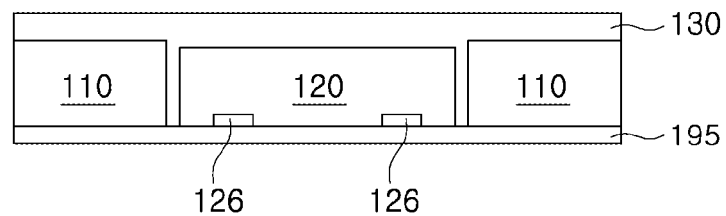

Referring to FIG. 7D, the electronic component 120 is encapsulated by an encapsulation material 130. A method of encapsulating the electronic component 120 is not particularly limited. For example, the electronic component 120 may be encapsulated by performing backside-lamination of a precursor of the encapsulation material 130 on the adhesive layer 195 so as to cover the frame 110 and the electronic component 120, followed by curing. The electronic component 120 may be fixed by the curing. Otherwise, the encapsulation material may be provided on the adhesive layer 195 so as to cover the frame 110 and the electronic component 120, and then cured. As a lamination method, for example, a method of separating a working tool in a cold press by cooling after performing a hot press method of pressing an object at a high temperature for a predetermined time and then cooling the object to room temperature by decompression, or the like, may be used. As an application method, for example, a screen printing method of applying ink using a squeeze, a spray printing method of misting ink to apply the ink, or the like, may be used. The curing may be drying the encapsulation material so as not to be completely cured in order to use a photolithography process, or the like, as a post process.

Figure 7E:
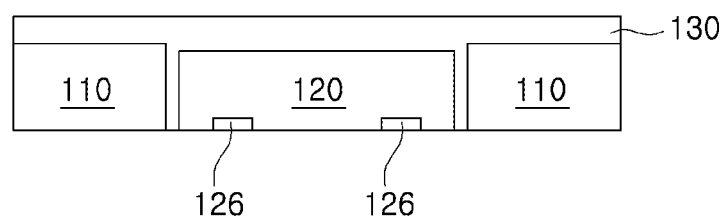

Referring to FIG. 7E, the adhesive layer 195 is delaminated. A delamination method is not particularly limited, but a method known in the art may be used.

Figure 7F:
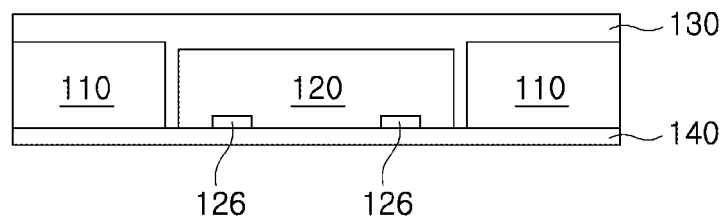

Referring to FIG. 7F, an insulating layer 140 is formed on a delaminated surface 112 of the frame 110 and a delamination surface 122 of the electronic component 120 delaminated from the adhesive layer. As a method of forming the insulating layer 140, a method known in the art may also be used. For example, the insulating layer 140 may be formed by laminating a precursor of the insulating layer so as to be connected to the delamination surface 112 of the frame 110 and the delamination surface 122 of the electronic component 120 delaminated from the adhesive layer, and curing the laminated precursor. Alternatively, the insulating layer may be formed by applying and curing an insulating material on the delamination surface 112 of the frame 110 and the delamination surface 122 of the electronic component 120 delaminated from the adhesive layer. As a lamination method, for example, a method of separating a working tool in a cold press by cooling after performing a hot press method of pressing an object at a high temperature for a predetermined time and then cooling the object to room temperature by decompression, or the like, may be used. As an application method, for example, a screen printing method of applying ink using a squeeze, a spray printing method of misting ink to apply the ink, or the like, may be used.

Figure 7G:
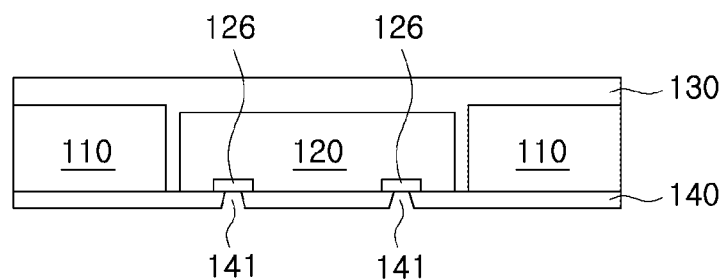

Referring to FIG. 7G, a via hole 141 is formed in the insulating layer 140 so that the electrode pad 126 of the electronic component 120 is exposed. The via hole 141 may be formed using a mechanical drill and/or laser drill. Here, the laser drill may be a $CO_2$ laser drill or YAG laser drill, but is not particularly limited thereto. In the event that the via hole 141 is formed using the mechanical drill and/or laser drill, resin smear in the holes may be removed by performing desmear treatment using a permanganate method, or the like. Meanwhile, in a case in which the insulating layer 140 contains a photo imagable dielectric material, the via hole 141 may be formed by a photo lithography method. As a result, a disposition precision may be excellent, and a fine pitch may be implemented.

Figure 7H:
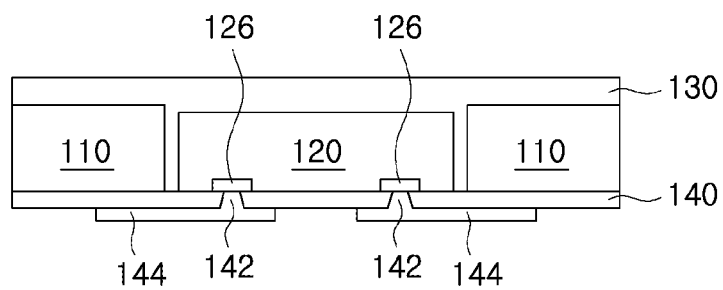

Referring to FIG. 7H, a conductive via 142 and a conductive pattern 144 are formed on the insulating layer 140. The conductive via 142 may be formed by filling the via hole 141 with a conductive material when the conductive pattern 144 is formed. The conductive via 142 and the conductive pattern 144 may be formed by a method known in the art. For example, the conductive via 142 and the conductive pattern 144 may be formed by electric copper plating or electroless copper plating, or the like, using a dry film pattern. In more detail, the conductive via 142 and the conductive pattern 144 may be formed by a method such as a chemical vapor deposition (CVD) method, a physical vapor deposition (PVD) method, a sputtering method, a subtractive method, an additive method, a semi-additive process (SAP), a modified semi-additive process (MSAP), or the like, but the method is not particularly limited thereto. In the event that the redistribution layer 140, 142, 144 is formed of a plurality of layers, methods illustrated in FIGS. 7F through 7H may be repetitively performed.

Figure 7I:
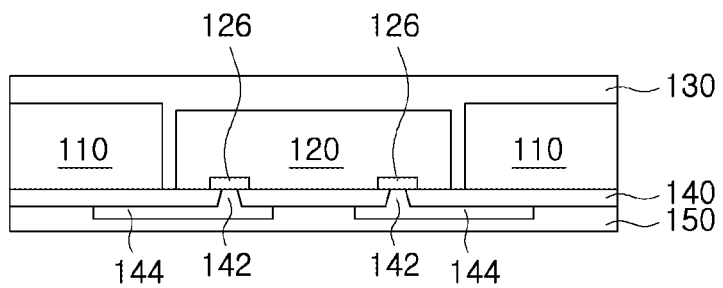

Referring to FIG. 7I, an external layer 150 connected to the redistribution layer 140, 142, 144 is formed. The external layer 150 may be formed by a method of laminating a precursor of the external layer 150 and curing the laminated precursor, a method of applying a material for forming the external layer 150 and curing the applied material, or the like. As a lamination method, for example, a method of separating a working tool in a cold press by cooling after performing a hot press method of pressing an object at a high temperature for a predetermined time and then cooling the object to room temperature by decompression, or the like, may be used. As an application method, for example, a screen printing method of applying ink using a squeeze, a spray printing method of misting ink to apply the ink, or the like, may be used. The curing may be drying the encapsulation material so as not to be completely cured in order to use a photolithography process, or the like, as a post process.

Figure 7J:
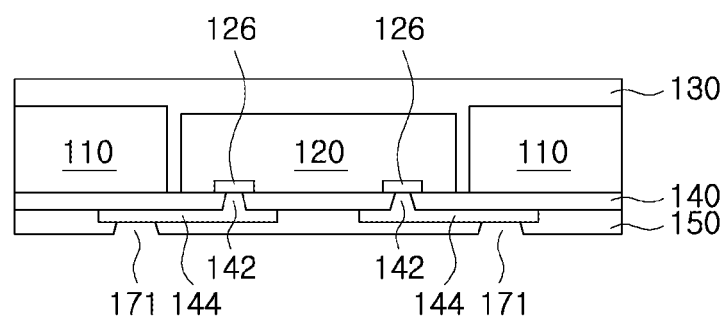

Referring to FIG. 7J, a first opening 171 is formed on a surface of the external layer 150 opposite to a surface of the external layer 150 connected to the redistribution layer 140, 142, 144 so that the conductive pattern 144 is partially exposed. The first opening 171 may be formed using a mechanical drill and/or laser drill. Here, the laser drill may be a $CO_2$ laser drill or YAG laser drill, but is not particularly limited thereto. Alternatively, the first opening 171 may be formed by a photo lithography method.

Figure 7K:
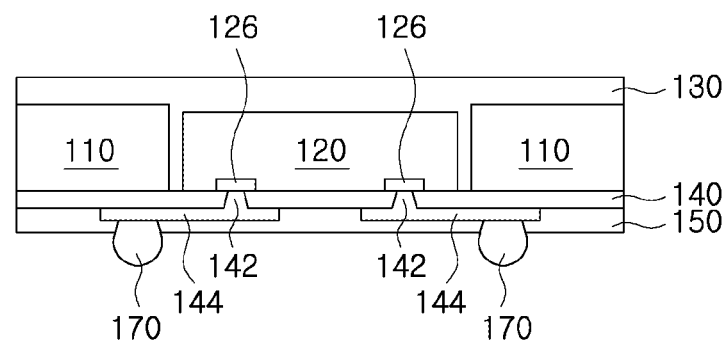

Referring to FIG. 7K, if necessary, a first external connection terminal 170 is formed in the first opening of the external layer 150. A method of forming the first external connection terminal 170 is not particularly limited, but the first external connection terminal 170 may be formed by a method well-known in the art depending on a structure or shape thereof. The first external connection terminal 170 may be fixed by reflow, and in order to increase fixation power, a portion of the first external connection terminal 170 may be embedded in the external layer, and the other portion thereof may be externally exposed, thereby improving reliability. In some cases, only the first opening 171 may be formed, and the first external connection terminal 170 may be formed by a separate process in a buyer firm of the package 100A as needed.

FIGS. 8A through 8F illustrate modified embodiments of the electronic component package of FIG. 5.

Among descriptions of the schematic modified embodiments of the electronic component package 100A, a description overlapping the description described above will be omitted, and a difference therebetween will mainly be described below.

Figure 8A:
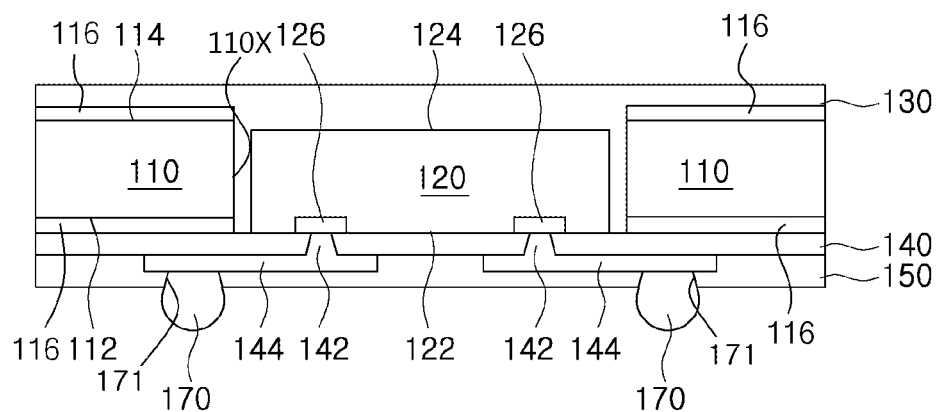
FIGS. 8A through 8F are diagrams schematically illustrating modified embodiments of the electronic component package of FIG. 5.

Referring to FIG. 8A, in the modified embodiment of the electronic component package 100A, a metal layer 116 is disposed on the first surface 112 and/or the second surface 114 of the frame 110. The metal layer 116 may be disposed on both of the first and second surfaces 112 and 114 of the frame 110 as illustrated in FIG. 8A, or unlike this. However, in another example, the metal layer 116 may be disposed only on any one of the first and second surfaces 112 and 114 thereof. The metal layer 116 may be patterned depending on requirements such as control of warpage of the package, or the like, and thus only a portion of the metal layer 116 may remain in a form of a conductive pattern (not illustrated). As a non-restrictive example, the metal layer 116 may be disposed on the first surface 112, and a conductive pattern (not illustrated) may be disposed on the second surface 114. On the contrary, the conductive pattern (not illustrated) may be disposed on the first surface 112, and the metal layer 116 may be disposed on the second surface 114.

Figure 8B:
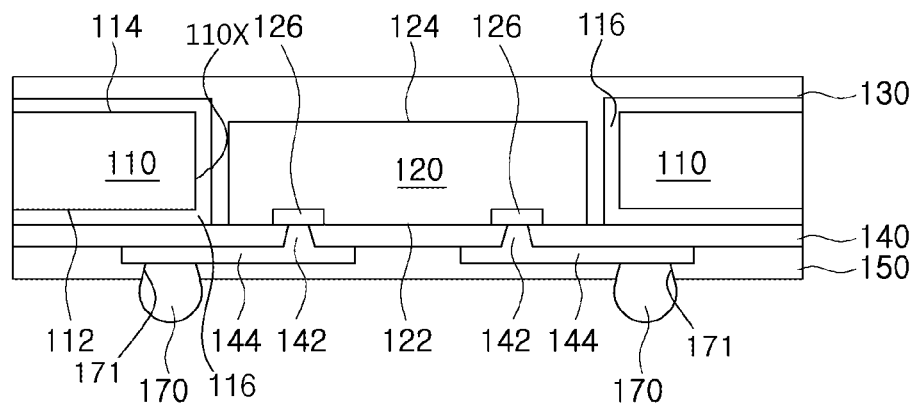

Referring to 8B, in another modified example of the electronic component package 100A, a metal layer 116 is disposed on an inner surface of the cavity 110X of the frame 110. The metal layer 116 may be disposed on all of the first and second surfaces 112 and 114 of the frame 110 and the inner surface of the cavity 110X of the frame as illustrated in FIG. 8B. However, in another example, the metal layer 116 may be disposed on one of the first and second surfaces 112 and 114 of the frame 110 and disposed on the inner surface of the cavity 110X of the frame. Alternatively, in yet another example, the metal layer 116 may not be disposed on the first and second surfaces 112 and 114 of the frame 110, but may be disposed only on the inner surface of the cavity 110X of the frame. If necessary, only a portion of the metal layer 116 disposed on the first surface 112 and/or the second surface 114 of the frame 110 may remain in a form of a conductive pattern (not illustrated).

Figure 8C:
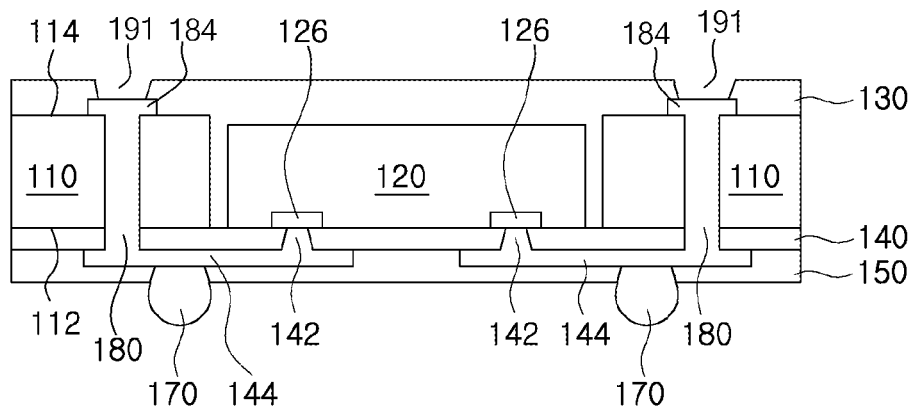

Referring to FIG. 8C, in another modified example of the electronic component package 100A, a penetration wiring 180 electrically connects to the redistribution layer 140, 142, 144 while penetrating between the first and second surfaces 112 and 114 of the frame 110. Further, a conductive pattern 184 is disposed on the second surface 114 of the frame 110 to thereby be electrically connected to the penetration wiring 180. The encapsulation material 130 has a second opening 191 that at least partially exposes the conductive pattern 184b. A second external connection terminal (not illustrated) exposed externally may be disposed in the second opening 191. Further, various separate passive components (not illustrated) may be disposed in the second openings 191.

Figure 8D:
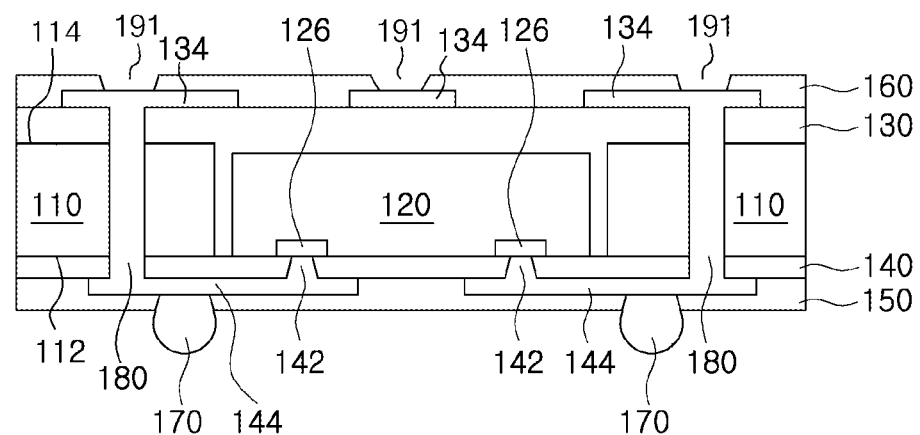

Referring to FIG. 8D, in another modified example of the electronic component package 100A, a penetration wiring 180 electrically connects to the redistribution layer 140, 142, 144 while penetrating between the first and second surfaces 112 and 114 of the frame 110. Further, a conductive pattern 134 is disposed on the encapsulation material 130 to thereby be electrically connected to the penetration wiring 180. In addition, a cover layer 160 connected to the encapsulation material 130 and having a second opening 191 at least partially exposing the conductive pattern 134 is further included in the electronic component package 100A. A second external connection terminal (not illustrated) exposed externally may be disposed in the second opening 191. Further, various separate passive components (not illustrated) may be disposed in the second openings 191.

Figure 8E:
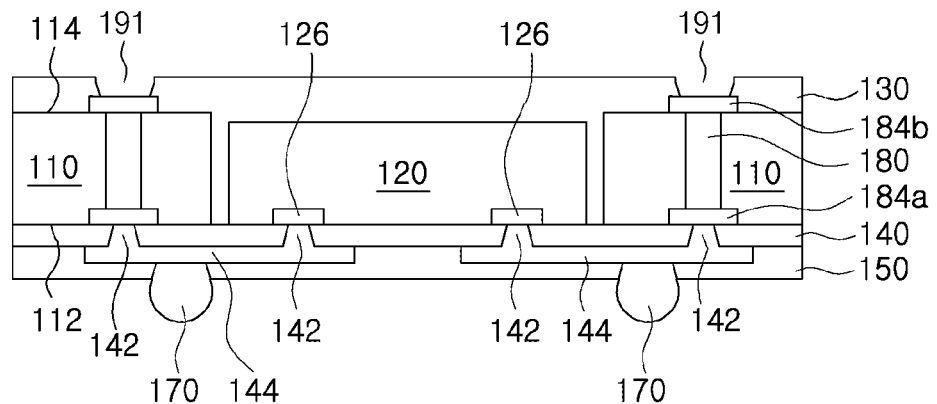

Referring to FIG. 8E, in another modified example of the electronic component package 100A, a penetration wiring 180 electrically connects to the redistribution layer 140, 142, 144 while penetrating between the first and second surfaces 112 and 114 of the frame 110, a first pad 184a disposed on the first surface 112 of the frame 110 to thereby be connected to the penetration wiring 180, and a second pad 184b disposed on the second surface 114 of the frame 110 to thereby be connected to the penetration wiring 180 may be further included. In this example, the encapsulation material 130 has a second opening 191 that at least partially exposes the conductive pattern 184b. A second external connection terminal (not illustrated) exposed externally may be disposed in the second opening 191. Further, various separate passive components (not illustrated) may be disposed in the second openings 191.

Figure 8F:
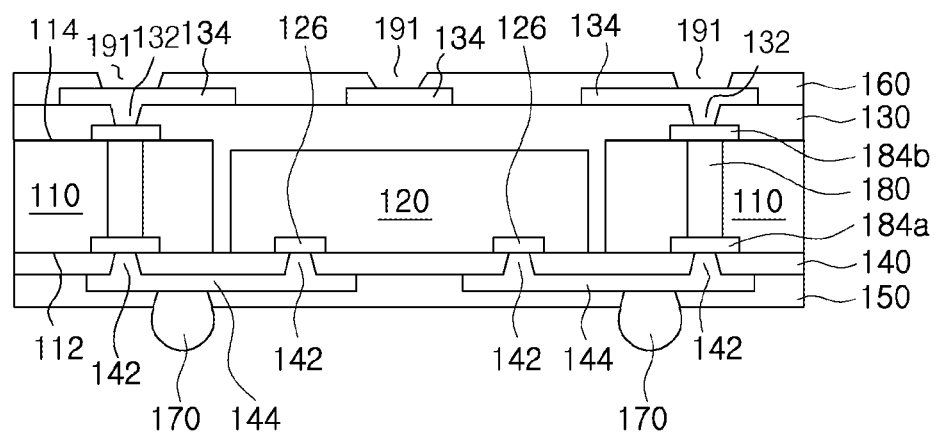

Referring to FIG. 8F, in another modified example of the electronic component package 100A, a penetration wiring 180 electrically connects to the redistribution layer 140, 142, 144 while penetrating between the first and second surfaces 112 and 114 of the frame 110. A first pad 184a is disposed on the first surface 112 of the frame 110 to thereby be connected to the penetration wiring 180, and a second pad 184b is disposed on the second surface 114 of the frame 110 to thereby be connected to the penetration wiring 180 may be further included. Further, a conductive pattern 134 disposed on the encapsulation material 130 and a conductive via 132 electrically connecting the conductive pattern 134 and the second pad 184b to each other while partially penetrating through the encapsulation material 130 are further included in the electronic component package 100A. In addition, a cover layer 160 connected to the encapsulation material 130 and having a second opening 191 at least partially exposing the conductive pattern 134 is further included. A second external connection terminal (not illustrated) exposed externally may be disposed in the second opening 191. Further, various separate passive components (not illustrated) may be disposed in the second openings 191.

A metal layer 116, which is a structure for improving a heat radiation property and/or shielding against electromagnetic waves, may be formed of a metal having high thermal conductivity. For example, copper (Cu), aluminum (Al), silver (Ag), tin (Sn), gold (Au), nickel (Ni), lead (Pb), palladium (Pd), alloys thereof, or the like, may be used, but the material of the metal layer 116 is not limited thereto. A conductive pattern (not illustrated) may serve as a redistribution pattern and/or a pad pattern, and may also improve the heat radiation property and/or shielding against the electromagnetic waves. Further, the conductive pattern may also serve to control warpage of the package depending on a disposition form thereof. Similarly, as a material for forming the conductive pattern, a conductive material, for example, copper (Cu), aluminum (Al), silver (Ag), tin (Sn), gold (Au), nickel (Ni), lead (Pb), palladium (Pd), alloys thereof, or the like, may be used, but the material for forming the conductive pattern is not limited thereto. In a case in which the metal layer 116 disposed in the inner surface of the cavity 110X of the frame 110 is connected to the metal layer 116 disposed on the first surface 112 and/or the second surface 114 of the frame 110 and/or the conductive pattern (not illustrated), heat may be easily radiated to an upper portion and/or a lower portion of the package 100A.

The penetration wiring 180 penetrating between the first and second surfaces 112 and 114 of the frame 110 may be configured to electrically connect conductive elements disposed to be adjacent to the first surface 112 of the frame 110 and conductive elements disposed to be adjacent to the second surface 114 thereof to each other, and as a material for forming the penetrating wiring 180, a conductive material such as copper (Cu), aluminum (Al), silver (Ag), tin (Sn), gold (Au), nickel (Ni), lead (Pb), palladium (Pd), alloys thereof, or the like, may be used. The number, an interval, a disposition form, and the like, of the penetrating wiring 180 are not particularly limited, and may be sufficiently changed by a person skilled in the art depending on a design. For example, the penetration wiring 180 may be disposed only in a certain pre-determined region of the frame 110. However, in yet another example, the penetration wiring 180 may be disposed in the entire region of the frame 110. In an example in which a metal, for example, an Fe—Ni based alloy, or the like is used as the material of the frame 110, an insulating material may be disposed between the metal and the penetration wiring 180 for electrical insulation with the penetration wiring 180. Upper and lower portions of the electronic component package may be electrically connected to each other through left and right side surfaces of the electronic component 120 due to the penetration wiring 180, and thus, wiring may be distributed, and another electronic component may be disposed and electrically connected in the upper portion. Therefore, space utility may be significantly improved, and a package-on-package structure, or the like, may be applied by connection in a three dimensional structure, and thus the electronic component package may be widely applied to present various modules or package application products.

The conductive pattern 184 disposed on the second surface 114 of the frame 110 may serve as a redistribution pattern and/or a pad pattern, and as a material for forming the conductive pattern 184, a conductive material such as copper (Cu), aluminum (Al), silver (Ag), tin (Sn), gold (Au), nickel (Ni), lead (Pb), palladium (Pd), alloys thereof, or the like, may be used. If necessary, a surface treatment layer may be further formed on an exposed portion of the conductive pattern 184. The surface treatment layer may be formed, for example, by electrolytic gold plating, electroless gold plating, organic solderablity preservative (OSP) surface treatment or electroless tin plating, electroless silver plating, electroless nickel plating/immersion gold plating, direct immersion gold (DIG) plating, hot air solder leveling (HASL), or the like.

The conductive pattern 134 disposed on the encapsulation material 130 may serve as a redistribution pattern and/or a pad pattern, and as a material for forming the conductive pattern 134, a conductive material such as copper (Cu), aluminum (Al), silver (Ag), tin (Sn), gold (Au), nickel (Ni), lead (Pb), palladium (Pd), alloys thereof, or the like, may be used. The conductive pattern 134 may be disposed on the entire surface of the encapsulation material 130, and thus, the second external connection terminal (not illustrated) and/or a separate passive component (not illustrated) may also be disposed on the entire surface of a cover layer 160 to be described below. Therefore, the electronic component package may be variously designed. If necessary, the surface treatment layer may be further formed on the exposed portion of the conductive pattern 134. The surface treatment layer may be formed, for example, by electrolytic gold plating, electroless gold plating, organic solderablity preservative (OSP) surface treatment or electroless tin plating, electroless silver plating, electroless nickel plating/immersion gold plating, direct immersion gold (DIG) plating, hot air solder leveling (HASL), or the like.

The first and second pads 184a and 184b may be configurations for easily forming the penetration wiring 180. As a material for forming the first and second pads 184a and 184b, a conductive material such as copper (Cu), aluminum (Al), silver (Ag), tin (Sn), gold (Au), nickel (Ni), lead (Pb), palladium (Pd), alloys thereof, or the like, may be used. If necessary, a surface treatment layer may be further formed on the first and second pads 184a and 184b. The surface treatment layer may be formed, for example, by electrolytic gold plating, electroless gold plating, organic solderablity preservative (OSP) surface treatment or electroless tin plating, electroless silver plating, electroless nickel plating/immersion gold plating, direct immersion gold (DIG) plating, hot air solder leveling (HASL), or the like. The first pad 184a may be disposed to be embedded in the frame 110 as illustrated in FIG. 8F. Unlike this, the first pad 184a may be disposed on the first surface 112 of the frame 110. In a case in which the first pad 184a is disposed on the first surface 112 of the frame 110, the first pad 184a may be disposed between the frame 110 and the redistribution layer 140, 142, 144 so that the frame 110 and the redistribution layer 140, 142, 144 may have a step therebetween. Alternatively, the first pad 184a may be disposed to be embedded in an insulating layer 140 of a first redistribution layer 140, 142, 144 of the redistribution layers 140, 142, 144.

Referring to FIG. 8F, the first pad 184a is embedded in the frame 110 by performing an embedded trace substrate (ETS) method. In this example, because a pad for the penetrating wiring is not disposed in the insulating layer 140 of the first redistribution layer 140, 142, 144 constituting the redistribution layers 140, 142, 144, a thickness of the insulating layer 140 may be significantly reduced, and as a result, a fine pitch of the conductive via 142 may be implemented. In addition, because a design area of the first redistribution layer 140, 142, 144 is increased, a degree of freedom in design may be increased, and as a result, the number of redistribution layers may be entirely decreased in a case in which the redistribution layer needs to be formed of a plurality of redistribution layers.

Even though the first and second pads 184a and 184b are disposed on the first and second surfaces 112 and 114 of the frame as illustrated in FIG. 8F, a conductive pattern (not illustrated) may be further disposed on the first and second surfaces 112 and 114 of the frame in addition to the first and second pads 184a and 184b.

The conductive via 132 partially penetrating the encapsulation material 130 may electrically connect various patterns 134 and 184b formed on different layers to each other, thereby forming an electrical path in the package 100A. As expected, a conductive material such as copper (Cu), aluminum (Al), silver (Ag), tin (Sn), gold (Au), nickel (Ni), lead (Pb), palladium (Pd), alloys thereof, or the like, may be used as a material for forming the conductive via 132. The conductive via 132 may be completely filled with the conductive material, or the conductive material may be formed on a wall of the via. Further, all shapes known in the art, such as a tapered shape of which a diameter is decreased downwardly, a reversely tapered shape of which a diameter is increased downwardly, a cylindrical shape, and the like, may be applied to the conductive via 132.

The cover layer 160 may be configured to protect the encapsulation material 130, the conductive pattern 134, and the like, from external physical or chemical damages. A material of the cover layer 160 is not particularly limited. For example, a solder resist may be used. In addition, various PID resins may be used. If necessary, the cover layer 160 may be composed of a plurality of layers. In a case in which the cover layer 160 is disposed, the second opening 191 may be formed in the cover layer 160, and in a case in which the cover layer 160 is not disposed, the second opening 191 may be formed in the encapsulation material 130.

The second external connection terminal (not illustrated) may be configured to physically and/or electrically connect another electronic component or package disposed on the electronic component package 100A, or the like. For example, another electronic component package may be mounted on the electronic component package 100A through the second external connection terminal (not illustrated), thereby forming a package-on-package structure. The second external connection terminal (not illustrated) may be disposed in the second opening 191 and connected to various conductive patterns 134, 184, and 184b exposed through the second opening 191. Therefore, the second external connection terminal may be electrically connected to the electronic component 120.

The second external connection terminal (not illustrated) may be formed of a conductive material, for example, copper (Cu), aluminum (Al), silver (Ag), tin (Sn), gold (Au), nickel (Ni), lead (Pb), palladium (Pd), solder, or the like. However, these materials are only examples, and the material of the second external connection terminal is not particularly limited thereto. An external connection terminal 170 may be a land, a ball, a pin, or the like. The external connection terminal 170 may be formed of a multilayer or single layer. In a case in which the external connection terminal 170 is formed of the multilayer, the external connection terminal 170 may contain a copper pillar and solder, and in a case in which the external connection terminal 170 is formed of the single layer, the external connection terminal 170 may contain tin-silver solder or copper. However, these cases are only examples, and the external connection terminal 170 is not limited thereto.

The passive component (not illustrated) may be a concept including various passive components included in electronic devices such as an inductor, a condenser, a resistor, and the like, and in a case in which the passive component (not illustrated) is disposed in the second opening 191, that is, in a case in which various passive components are disposed on a surface of the package, the package may have a system-in-package structure. The passive component (not illustrated) may be disposed in the second opening 191 and connected to various conductive patterns 134, 184, and 184b exposed through the second opening 191. Therefore, the passive component may be electrically connected to the electronic component 120.

Figure 9:
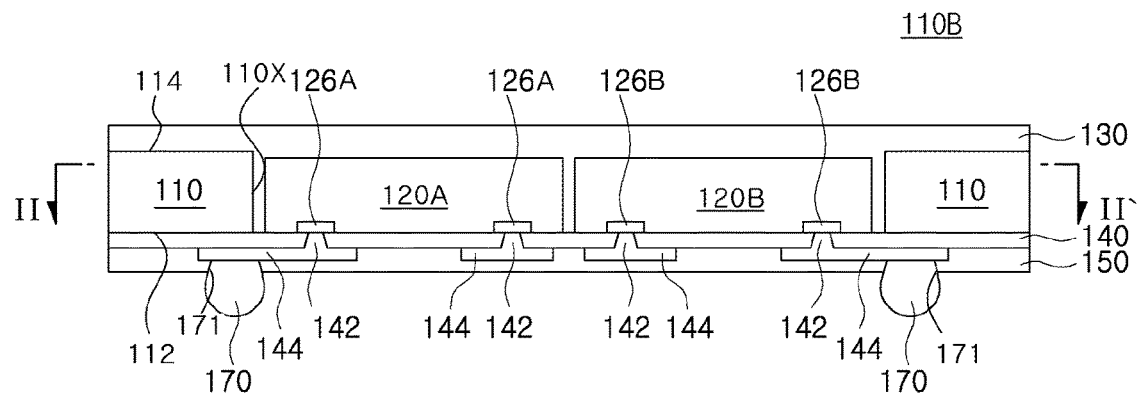
FIG. 9 is a cross-sectional diagram schematically illustrating another embodiment of the electronic component package.

FIG. 9 illustrates a cross-sectional view of another embodiment of the electronic component package.

Figure 10:
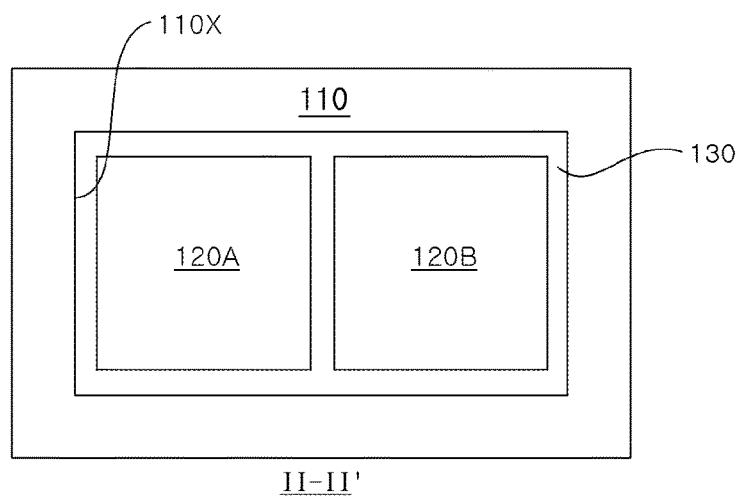
FIG. 10 is a schematic cut-away plan diagram of the electronic component package of FIG. 9 taken along line II-II'.

FIG. 10 illustrates a cut-away plan view of the electronic component package of FIG. 9 taken along line II-II'.

Among descriptions of the electronic component package 100B, a description overlapping the description of the electronic component package 100A described above will be omitted, and a difference therebetween will mainly be described below.

Referring to FIGS. 9 and 10, an electronic component package 100B according to another embodiment includes a frame 110 having first and second surfaces 112 and 114 opposing each other and a cavity 110X penetrating between the first and second surfaces 112 and 114, a plurality of electronic components 120A and 120B disposed in the cavity 110X of the frame 110, a redistribution layer 140, 142, 144 disposed to be adjacent to the first surface 112 of the frame 110 and electrically connected to the plurality of electronic components 120A and 120B, and an encapsulating material 130 encapsulating the plurality of electronic components 120A and 120B and having an elastic modulus smaller than that of a material of the frame 110.

The plurality of electronic components 120A and 120B may be the same as or different from each other. The plurality of electronic components 120A and 120B may have electrode pads 126A and 126B electrically connected to the redistribution layer 140, 142, 144, respectively. The electrode pads 126A and 126B may be redistributed by the redistribution layer 140, 142, 144, respectively. The numbers, intervals, disposition forms, and the like, of the plurality of electronic components 120A and 120B are not particularly limited, and may be sufficiently changed by a person skilled in the art depending on a design. For example, the number of plurality of electronic components 120A and 120B may be two as illustrated in FIGS. 9 and 10, but is not limited thereto. That is, three, four, or more electronic components may be disposed.

In a case in which the plurality of electronic components 120A and 120B are disposed, similarly, warpage may be controlled due to stress relaxation by the encapsulation material 130 and support by the frame 110. In the case in which the plurality of electronic components 120A and 120B are disposed, similarly, an entire area ratio occupied by the plurality of electronic components 120A and 120B may be more than 15%, such as about 30% to 90%. In this case, warpage may be controlled as described above. That is, in the case in which the plurality of electronic components 120A and 120B are disposed, when an effective insulation thickness of the redistribution layer 140, 142, 144 is equal to or less than 1/10 of a thickness of the remaining portion of the package (except for an external layer), which is sufficiently thin, similarly, warpage caused by stress generated in the redistribution layer 140, 142, 144 may be avoided.

Because a method of manufacturing the electronic component package 100B according to FIGS. 9 and 10 is similar to the method of manufacturing the electronic component package 100A according to FIGS. 8A to 8F for disposing of the plurality of electronic components 120A and 120B, a description thereof will be omitted.

FIGS. 11A through 11F illustrate schematic modified embodiments of the electronic component package of FIG. 9.

Among descriptions of the schematic modified embodiments of the electronic component package 100B, a description overlapping the description described above will be omitted, and a difference therebetween will mainly be described below.

Figure 11A:
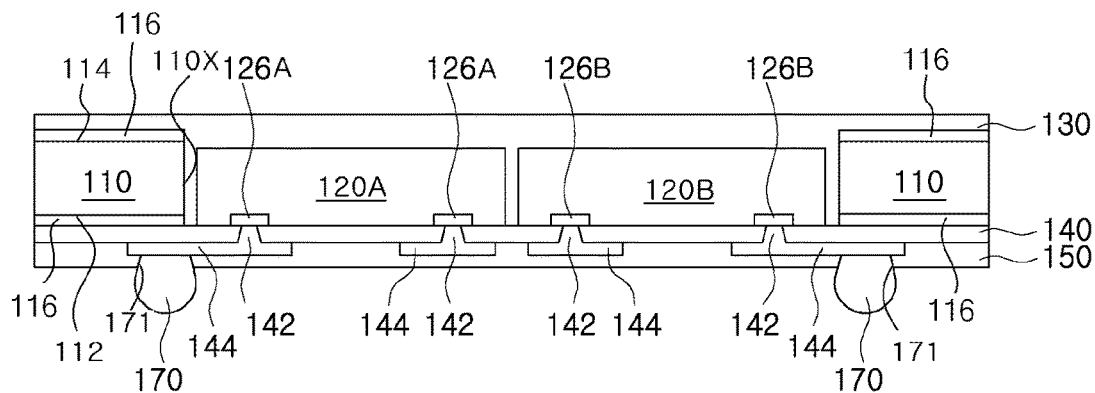
FIGS. 11A through 11F are diagrams schematically illustrating modified embodiments of the electronic component package of FIG. 9.

Referring to FIG. 11A, in a modified example of the electronic component package 100B, a metal layer 116 is disposed on the first surface 112 and/or the second surface 114 of the frame 110. The metal layer 116 may be disposed on both of the first and second surfaces 112 and 114 of the frame 110 as illustrated in FIG. 11A, or in yet another example, the metal layer 116 may be disposed only on any one of the first and second surfaces 112 and 114 thereof. The metal layer 116 may be patterned depending on requirements such as control of warpage of the package, or the like, and thus only a portion of the metal layer 116 may remain in a form of a conductive pattern (not illustrated). As a non-restrictive example, the metal layer 116 may be disposed on the first surface 112, and a conductive pattern (not illustrated) may be disposed on the second surface 114. On the contrary, the conductive pattern (not illustrated) may be disposed on the first surface 112, and the metal layer 116 may be disposed on the second surface 114.

Figure 11B:
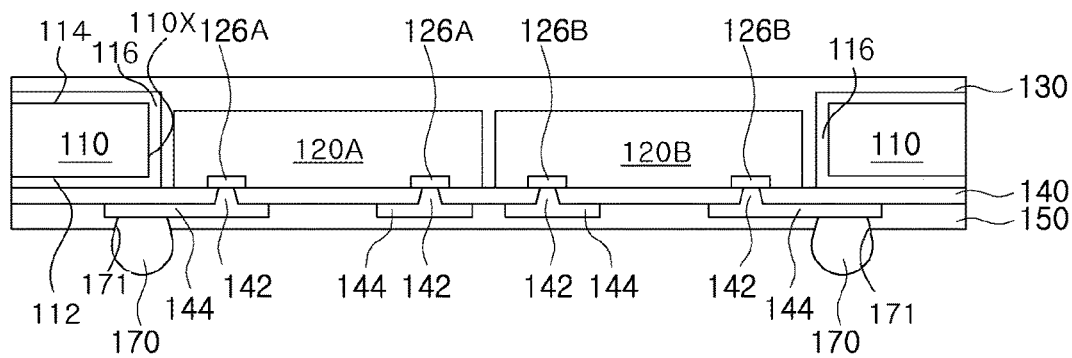

Referring to 11B, in another modified example of the electronic component package 100B, a metal layer 116 is disposed on an inner surface of the cavity 110X of the frame 110. The metal layer 116 may be disposed on all of the first and second surfaces 112 and 114 of the frame 110 and the inner surface of the cavity 110X of the frame as illustrated in FIG. 11B. In yet another example, however, the metal layer 116 may be disposed on one of the first and second surfaces 112 and 114 of the frame 110 and disposed on the inner surface of the cavity 110X of the frame. Alternatively, the metal layer 116 is not disposed on the first and second surfaces 112 and 114 of the frame 110, but may be disposed on the inner surface of the cavity 110X of the frame. If necessary, only a portion of the metal layer 116 disposed on the first surface 112 and/or the second surface 114 of the frame 110 may remain in a form of a conductive pattern (not illustrated).

Figure 11C:
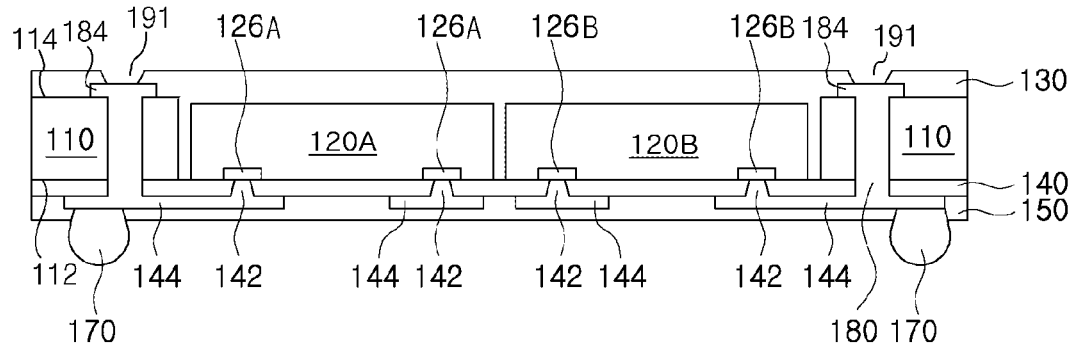

Referring to FIG. 11C, in another modified example of the electronic component package 100B, a penetration wiring 180 electrically connects to the redistribution layer 140, 142, 144 while penetrating between the first and second surfaces 112 and 114 of the frame 110. Further, a conductive pattern 184 disposed on the second surface 114 of the frame 110 to thereby be electrically connected to the penetration wiring 180 may be further included. The encapsulation material 130 may have a second opening 191 at least partially exposing the conductive pattern 184b. A second external connection terminal (not illustrated) exposed to the outside may be disposed in the second opening 191. Further, various separate passive components (not illustrated) may be disposed in the second openings 191.

Figure 11D:
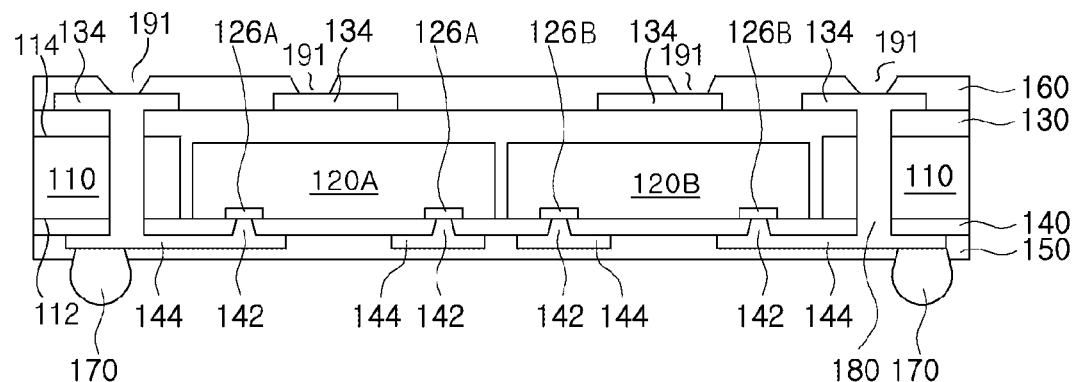

Referring to FIG. 11D, in another modified example of the electronic component package 100B, a penetration wiring 180 electrically connects to the redistribution layer 140, 142, 144 while penetrating between the first and second surfaces 112 and 114 of the frame 110. Further, a conductive pattern 134 disposed on the encapsulation material 130 to thereby be electrically connected to the penetration wiring 180 may be further included. In addition, a cover layer 160 connected to the encapsulation material 130 and having a second opening 191 at least partially exposing the conductive pattern 134 may be further included. A second external connection terminal (not illustrated) exposed externally may be disposed in the second opening 191. Further, various separate passive components (not illustrated) may be disposed in the second openings 191.

Figure 11E:
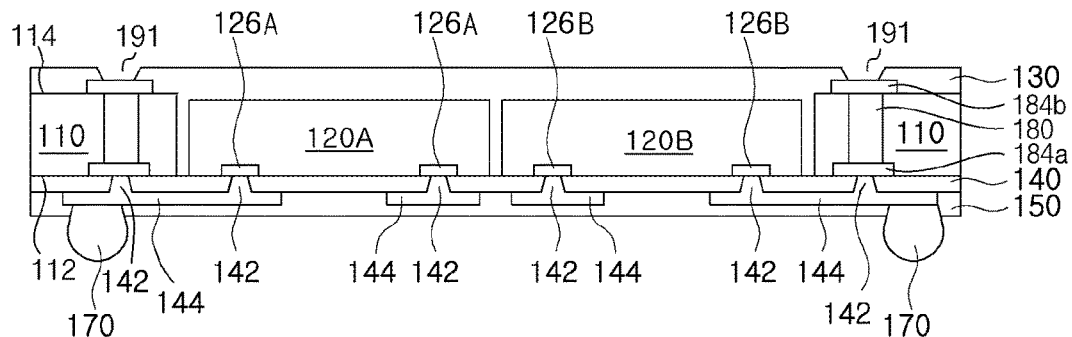
Figure 11F:
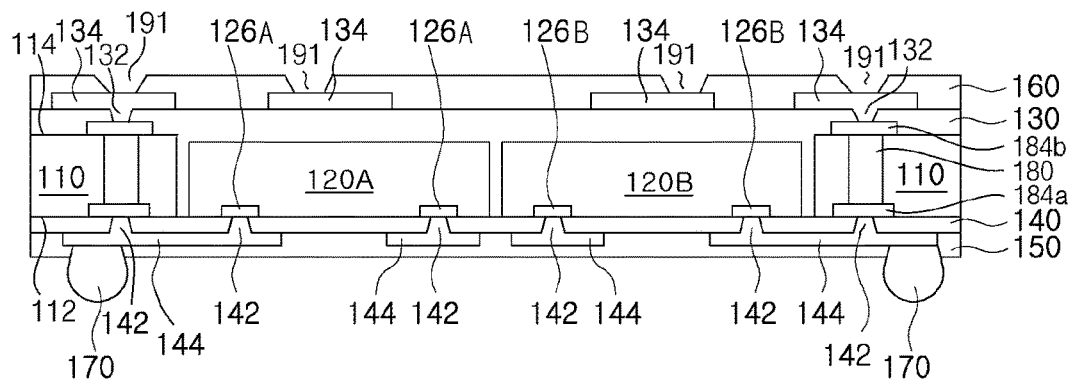

Referring to FIG. 11E, in another modified example of the electronic component package 100B, similarly, a penetration wiring 180 electrically connects to the redistribution layer 140, 142, 144 while penetrating between the first and second surfaces 112 and 114 of the frame 110. A first pad 184a is disposed on the first surface 112 of the frame 110 to thereby be connected to the penetration wiring 180, and a second pad 184b is disposed on the second surface 114 of the frame 110 to thereby be connected to the penetration wiring 180. The encapsulation material 130 has a second opening 191 at least partially exposing a conductive pattern 184. A second external connection terminal (not illustrated) exposed externally may be disposed in the second opening 191. Further, various separate passive components (not illustrated) may be disposed in the second openings 191.

Referring to FIG. 11E, in another modified example of the electronic component package 100B, a penetration wiring 180 electrically connects to the redistribution layer 140, 142, 144 while penetrating between the first and second surfaces 112 and 114 of the frame 110. A first pad 184a is disposed on the first surface 112 of the frame 110 to thereby be connected to the penetration wiring 180, and a second pad 184b is disposed on the second surface 114 of the frame 110 to thereby be connected to the penetration wiring 180. Further, a conductive pattern 134 disposed on the encapsulation material 130 and a conductive via 132 electrically connecting the conductive pattern 134 and the second pad 184b to each other while partially penetrating through the encapsulation material 130 are further included. In addition, a cover layer 160 connected to the encapsulation material 130 and having a second opening 191 at least partially exposing the conductive pattern 134 is further included. A second external connection terminal (not illustrated) exposed externally may be disposed in the second opening 191. Further, various separate passive components (not illustrated) may be disposed in the second openings 191.

Figure 12:
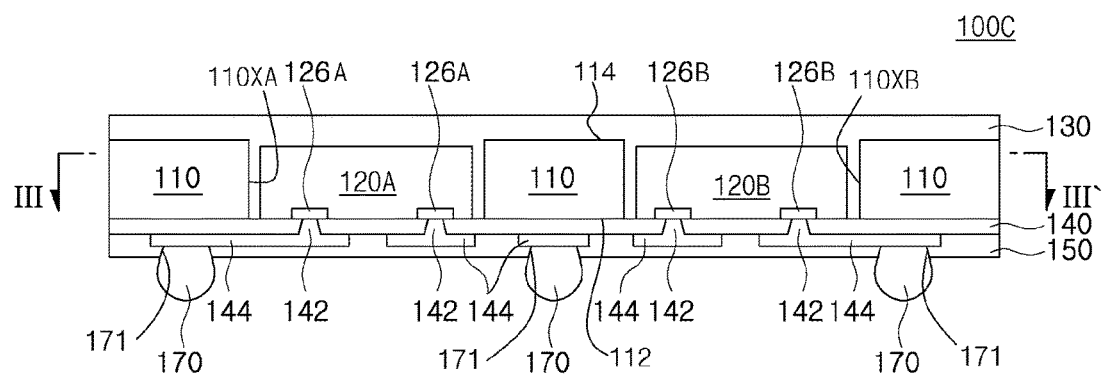
FIG. 12 is a cross-sectional diagram schematically illustrating another embodiment of the electronic component package.

FIG. 12 illustrates a cross-sectional view of another embodiment of the electronic component package.

Figure 13:
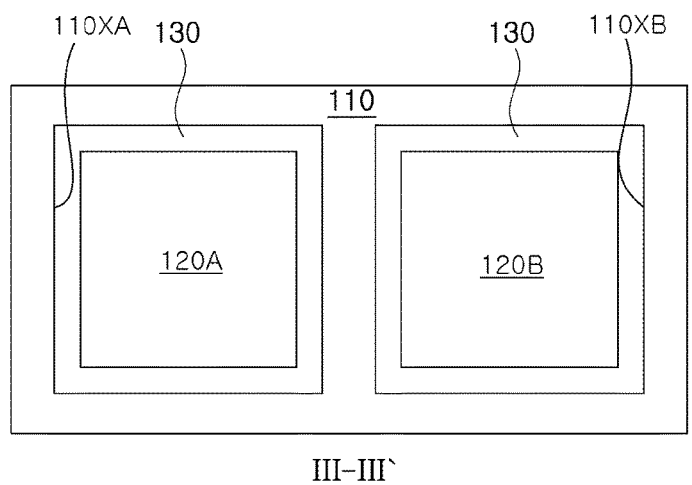
FIG. 13 is a schematic cut-away plan diagram of the electronic component package of FIG. 12 taken along line III-III'.

FIG. 13 illustrates a schematic cut-away plan view of the electronic component package of FIG. 12 taken along line III-III'.

Among descriptions of the electronic component package 100C according to FIGS. 12 and 13, a description overlapping the description of the electronic component packages described above will be omitted, and a difference therebetween will mainly be described below.

Referring to FIGS. 12 and 13, an electronic component package 100C according to another embodiment includes a frame 110 having first and second surfaces 112 and 114 opposing each other and a plurality of cavities 110XA and 110XB penetrating between the first and second surfaces 112 and 114, electronic components 120A and 120B disposed in the plurality of cavities 110XA and 110XB of the frame 110, respectively, a redistribution layer 140, 142, 144 disposed to be adjacent to the first surface 112 of the frame 110 and electrically connected to the electronic components 120A and 120B, and an encapsulating material 130 encapsulating the electronic components 120A and 120B and having an elastic modulus smaller than that of a material of the frame 110.

Areas, shapes, or the like, of the plurality of cavities 110XA and 110XB may be the same as or different from each other, and the electronic components 120A and 120B disposed in the cavities 110XA and 110XB, respectively, may also be the same as or different from each other. The numbers, intervals, disposition forms, and the like, of the plurality of cavities 110XA and 110XB and the electronic components 120A and 120B disposed therein, respectively, are not particularly limited, and may be sufficiently changed by a person skilled in the art depending on a design. For example, the number of plurality of cavities 110XA and 110XB may be two as illustrated in FIGS. 12 and 13, but is not limited thereto. That is, the number of plurality of cavities 110XA and 110XB may be three, four, or more. Further, the number of electronic components 120A and 120B disposed in the cavities 110XA and 110XB, respectively, may be one as illustrated in FIGS. 12 and 13, but is not limited thereto. That is, the number of electronic components 120A and 120B may be two, three, or more.

In a case in which the frame 110 has the plurality of cavities 110XA and 110XB, and the electronic components 120A and 120B are disposed in the plurality of cavities 110XA and 110XB, respectively, similarly, warpage may be controlled due to stress relaxation by the encapsulation material 130 and support by the frame 110. In a case in which the frame 110 has the plurality of cavities 110XA and 110XB, and the electronic components 120A and 120B are disposed in the plurality of cavities 110XA and 110XB, respectively, similarly, an entire area ratio occupied by the plurality of electronic components 120A and 120B may be more than 15%, such as about 30% to 90%. In this case, warpage may be controlled as described above. That is, in the case in which the frame 110 has the plurality of cavities 110XA and 110XB, and the electronic components 120A and 120B are disposed in the plurality of cavities 110XA and 110XB, respectively, when an effective insulation thickness of the redistribution layer 140, 142, 144 is equal to or less than ⅒ of a thickness of the remaining portion of the package (except for an external layer), which is sufficiently thin, similarly, warpage caused by stress generated in the redistribution layer 140, 142, 144 may be avoided.

Since a method of manufacturing the electronic component package 100C according to FIGS. 12 and 13 is substantially the same as the method of manufacturing the electronic component package 100A according to FIGS. 5 and 6 except for forming the plurality of cavities 110XA and 110XB and disposing the plurality of electronic components 120A and 120B in the plurality of cavities 110XA and 110XB, respectively, a description thereof will be omitted.

FIGS. 14A through 14F illustrate modified embodiments of the electronic component package of FIG. 12.

Among descriptions of the schematic modified embodiments of the electronic component package 100C, a description overlapping the description described above will be omitted, and a difference therebetween will mainly be described below.

Figure 14A:
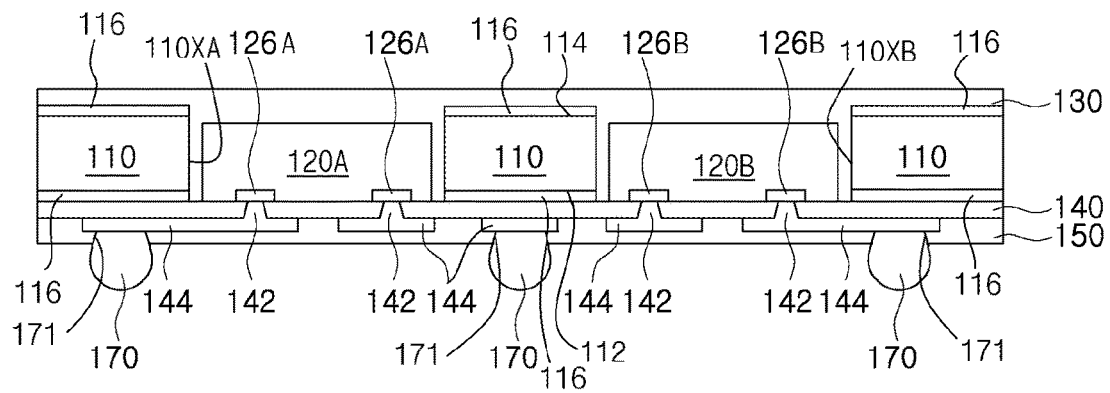
FIGS. 14A through 14F are diagrams schematically illustrating modified embodiments of the electronic component package of FIG. 12.

Referring to FIG. 14A, in a modified example of the electronic component package 100C, similarly, a metal layer 116 is disposed on the first surface 112 and/or the second surface 114 of the frame 110. The metal layer 116 may be disposed on both of the first and second surfaces 112 and 114 of the frame 110 as illustrated in FIG. 14A, or unlike this, in another example, the metal layer 116 may be disposed only on any one of the first and second surfaces 112 and 114 thereof. The metal layer 116 may be patterned depending on requirements such as control of warpage of the package, or the like, and thus only a portion of the metal layer 116 may remain in a form of a conductive pattern (not illustrated). As a non-restrictive example, the metal layer 116 may be disposed on the first surface 112, and a conductive pattern (not illustrated) may be disposed on the second surface 114. On the contrary, the conductive pattern (not illustrated) may be disposed on the first surface 112, and the metal layer 116 may be disposed on the second surface 114.

Figure 14B:
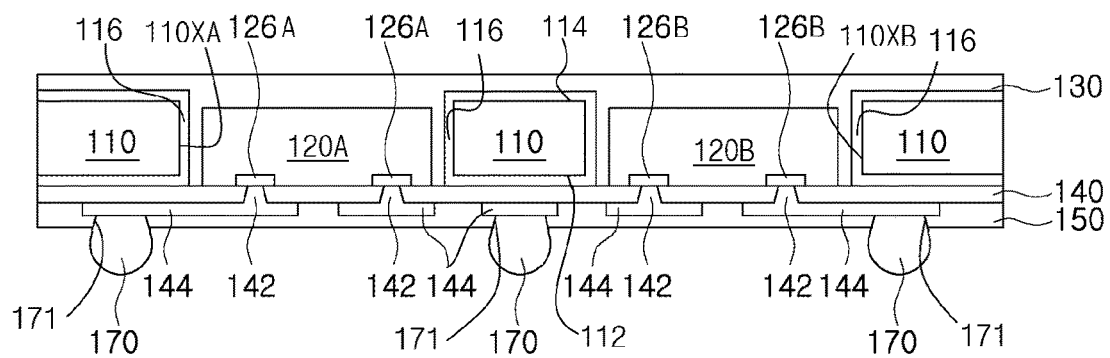

Referring to 14B, in another modified example of the electronic component package 100C, a metal layer 116 is disposed on inner surfaces of the plurality of cavities 110XA and 110XB of the frame 110. The metal layer 116 may be disposed on all of the first and second surfaces 112 and 114 of the frame 110 and the inner surfaces of the plurality of cavities 110XA and 110XB of the frame as illustrated in FIG. 14B. In another example, however, the metal layer 116 is disposed on one of the first and second surfaces 112 and 114 of the frame 110 and disposed on the inner surface of the plurality of cavities 110XA and 110XB of the frame. Alternatively, the metal layer 116 is not disposed on the first and second surfaces 112 and 114 of the frame 110, but may be disposed only on the inner surfaces of the plurality of cavities 110XA and 110XB of the frame. If necessary, only a portion of the metal layer 116 disposed on the first surface 112 and/or the second surface 114 of the frame 110 may remain in a form of a conductive pattern (not illustrated).

Figure 14C:
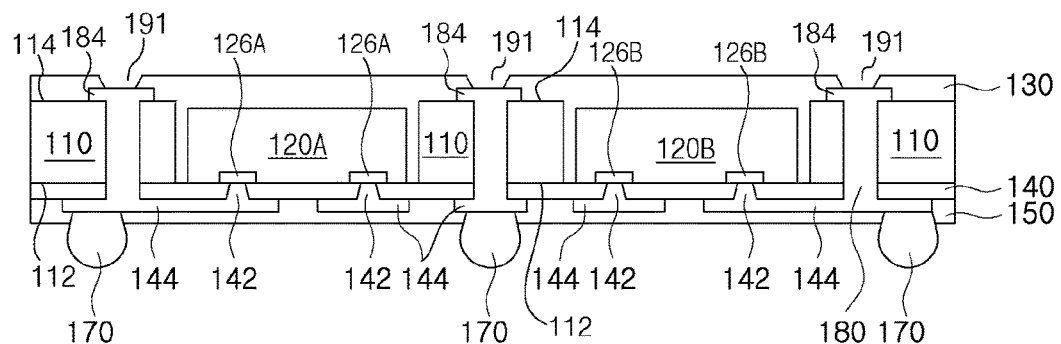

Referring to FIG. 14C, in the modified example of the electronic component package 100C, a penetration wiring 180 electrically connects to the redistribution layer 140, 142, 144 while penetrating between the first and second surfaces 112 and 114 of the frame 110. Further, a conductive pattern 184 disposed on the second surface 114 of the frame 110 to thereby be electrically connected to the penetration wiring 180 may be further included. The encapsulation material 130 has a second opening 191 at least partially exposing a conductive pattern 184b. A second external connection terminal (not illustrated) exposed externally may be disposed in the second opening 191. Further, various separate passive components (not illustrated) may be disposed in the second openings 191.

Figure 14D:
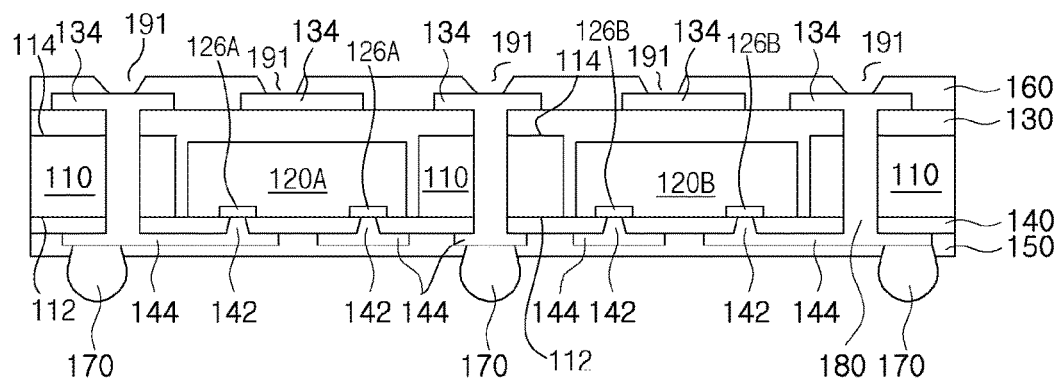

Referring to FIG. 14D, in another modified example of the electronic component package 100C, a penetration wiring 180 electrically connects to the redistribution layer 140, 142, 144 while penetrating between the first and second surfaces 112 and 114 of the frame 110. Further, a conductive pattern 134 is disposed on the encapsulation material 130 to thereby be electrically connected to the penetration wiring 180 may be further included. In addition, a cover layer 160 is connected to the encapsulation material 130 and has a second opening 191 at least partially exposing the conductive pattern 134. A second external connection terminal (not illustrated) exposed externally may be disposed in the second opening 191. Further, various separate passive components (not illustrated) may be disposed in the second openings 191.

Figure 14E:
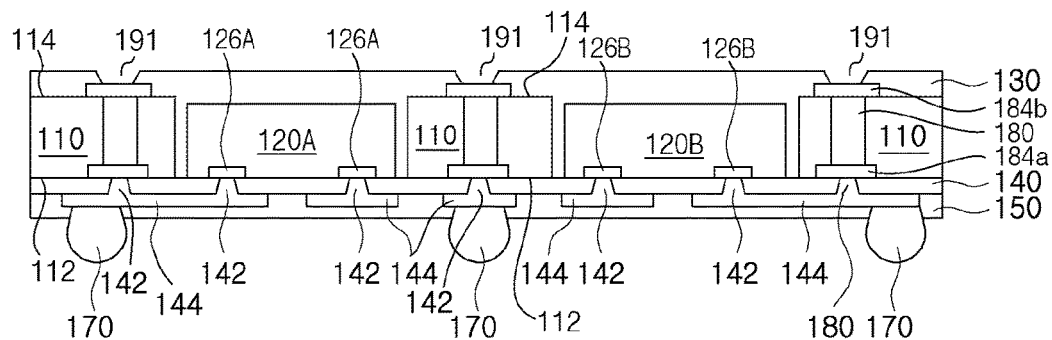

Referring to FIG. 14E, in another modified example of the electronic component package 100C, a penetration wiring 180 electrically connects to the redistribution layer 140, 142, 144 while penetrating between the first and second surfaces 112 and 114 of the frame 110. A first pad 184a is disposed on the first surface 112 of the frame 110 to thereby be connected to the penetration wiring 180, and a second pad 184b is disposed on the second surface 114 of the frame 110 to thereby be connected to the penetration wiring 180. In this example, the encapsulation material 130 has a second opening 191 at least partially exposing a conductive pattern 184b. A second external connection terminal (not illustrated) exposed externally may be disposed in the second opening 191. Further, various separate passive components (not illustrated) may be disposed in the second openings 191.

Figure 14F:
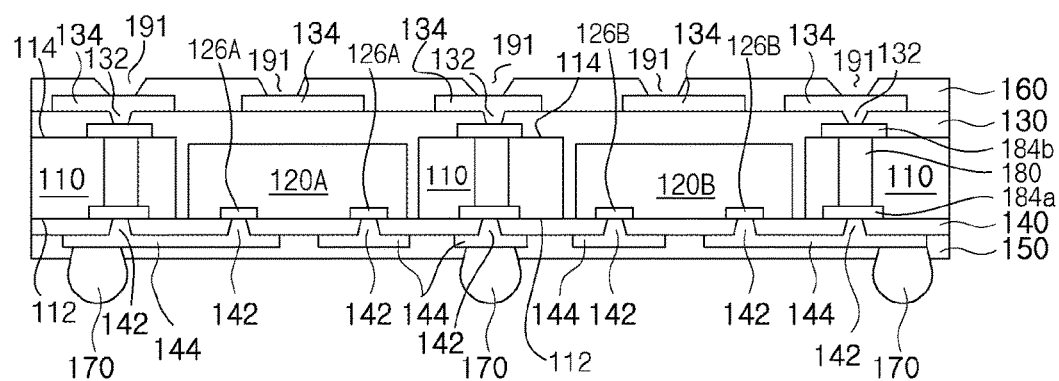

Referring to FIG. 14F, in another modified example of the electronic component package 100C, a penetration wiring 180 electrically connects to the redistribution layer 140, 142, 144 while penetrating between the first and second surfaces 112 and 114 of the frame 110. A first pad 184a is sposed on the first surface 112 of the frame 110 to thereby be connected to the penetration wiring 180, and a second pad 184b is disposed on the second surface 114 of the frame 110 to thereby be connected to the penetration wiring 180. Further, a conductive pattern 134 disposed on the encapsulation material 130 and a conductive via 132 electrically connecting the conductive pattern 134 and the second pad 184b to each other while partially penetrating through the encapsulation material 130 are further included in the electronic component package 100C. In addition, a cover layer 160 connected to the encapsulation material 130 and having a second opening 191 at least partially exposing the conductive pattern 134 may be further included. A second external connection terminal (not illustrated) exposed externally may be disposed in the second opening 191. Further, various separate passive components (not illustrated) may be disposed in the second openings 191.

Package-on-Package Structure

The electronic component packages 100A to 100C according to the present description and the modified embodiments thereof may be applied to a package-on-package structure in various shapes. For example, among the modified embodiments of the electronic component packages 100A to 100C, the modified embodiment having the penetrating wiring 180 may be disposed as a lower package, and the electronic component packages 100A to 100C having various forms or electronic component packages having various different forms (not illustrated) may be disposed on the lower package as an upper package. As an example, the electronic component of the lower package may be various kinds of application process chips, and the electronic component of the upper package may be various kinds of memory chips, but the electronic components are not limited thereto. Physical and/or electrical connection between the upper and lower packages may be performed by the second external connection terminal (not illustrated) described above.

System-in-Package Structure

The electronic component packages 100A to 100C according to the present description and the modified embodiments thereof may be applied to a system-in-package structure in various forms. For example, among the modified embodiments of the electronic component packages 100A to 100C, the modified embodiment having the penetrating wiring 180, the cover layer 160, and the conductive pattern 134 may be disposed as a lower package, and various other passive components (not illustrated) may be disposed on a surface of the lower package. In addition, the electronic component packages 100A to 100D having various forms or electronic component packages having various different forms (not illustrated) may be disposed as an upper package together with the passive components. The passive components (not illustrated) may be physically and/or electrically connected to various kinds of patterns 134, 184, and 184B exposed through the second openings 191.

Experimental Example (Measuring Method)

Measuring methods of various physical property values, or the like, disclosed in experiments were as follows.

1. Elastic Modulus: The physical property was measured through a standard tensile test.

2. Elongation: The physical property was measured through a standard tensile test.

3. Coefficient of Thermal Expansion: The physical property was measured using a thermo mechanical analyzer and a dynamic thermal analyzer.

4. Warpage: Warpage of a manufactured package was measured at room temperature using a Moire analyzer.

5. Cracks: Cracks generated in corners of a surface of an electronic component of the manufactured package covered by the encapsulation material were measured at room temperature using a scanning acoustic microscope.

Experiment 1

First, warpage depending on an area ratio ($S_a/S_t*100$) of an area $S_a$ occupied by an electronic component to an entire area $S_t$ of an electronic component package in a plane was measured using the electronic component package according to the embodiment, and the results were illustrated in the following Table 1. Meanwhile, in the electronic component package used in the experiment, a thickness of a frame was 410 μm, a thickness of the electronic component was 405 μm, and a thickness of an encapsulation material covering a back side of the electronic component was 40 μm. A redistribution layer was a single layer, and an effective insulation thickness was 15 μm.

TABLE 1

| No. | Area Ratio (%) | Elastic Modulus (GPa) | | Warpage (μm) |
|---|---|---|---|---|
| | | Frame | Encapsulation Material | |
| 1* | 15 | 27 | 27 | OK |
| 2 | 15 | 27 | 5 | OK |
| 3* | 20 | 27 | 27 | NG |
| 4* | 25 | 27 | 27 | NG |
| 5* | 61 | 27 | 27 | NG |
| 6* | 80 | 27 | 27 | NG |
| 7 | 20 | 27 | 5 | OK |
| 8 | 25 | 27 | 5 | OK |
| 9 | 61 | 27 | 5 | Not bad |
| 10 | 80 | 27 | 5 | Not bad |

Meanwhile, elongation of encapsulation materials used in samples 1 and 3 to 6 was 1.2% to 1.6%, and coefficient of thermal expansion thereof was 5 ppm/° C. to 7 ppm/° C. Further, elongation of encapsulation materials used in samples 2 and 7 to 10 was 3%, and coefficient of thermal expansion thereof was 40 ppm/° C. Further, elongation of frames used in samples 1 to 10 was 1.0% to 1.4%, and coefficient of thermal expansion thereof was 10 ppm/° C. to 11 ppm/° C. In addition, modulus of redistribution layers used in samples 1 to 10 was 1.3 GPa.

Meanwhile, in Table 1, the samples 1 and 3 to 6 in which the elastic modulus of the encapsulation material was the same as that of the frame were Comparative Examples, and the samples 2 and 7 to 10 in which the elastic modulus of the encapsulation material was smaller than that of the frame were Experimental Examples prepared according to the present description. Further, "OK" indicates a case in which warpage of 5 mm or less was generated, "Not bad" indicates a case in which warpage of more than 5 mm to less than 8 mm was generated, and "NG" indicates a case in which warpage of 8 mm or more was generated based on a panel.

It may be appreciated that in the Comparative Example (sample 1) in which the area ratio occupied by the electronic component was 15% or less, an influence of warpage of the electronic component was small, and thus there was also no warpage in the package. However, it may be appreciated that in cases (samples 3 to 6) in which the area ratio occupied by the electronic component was more than 15%, the influence of warpage of the electronic component was increased, and thus, severe warpage of the package was generated. On the contrary, it may be appreciated that in Experimental Examples prepared according to the present description, in cases (samples 7 to 10) in which the area ratio occupied by the electronic component was more than 15% or more, as well as a case (sample 2) in which the area ratio occupied by the electronic component was 15% or less, warpage of the package was relatively insignificant as compared to Comparative Examples.

Experiment 2

Next, warpage of an electronic component package depending on elastic modulus values of a frame and an encapsulation material was measured using the electronic component package according to the present description, and the results were illustrated in the following Table 2. Meanwhile, in the electronic component package used in the experiment, a thickness of a frame was 410 μm, a thickness of the electronic component was 405 μm, and a thickness of an encapsulation material covering a back side of the electronic component was 40 μm. A redistribution layer was a single layer, and an effective insulation thickness was 15 μm.

TABLE 2

| No. | Area Ratio (%) | Elastic Modulus (GPa) | | Warpage (μm) |
|---|---|---|---|---|
| | | Frame | Encapsulation Material | |
| 11* | 45 | 27 | 27 | NG |
| 12* | 45 | 27 | 40 | NG |
| 13 | 45 | 27 | 5 | OK |
| 14 | 45 | 27 | 0.5 | OK |
| 15 | 45 | 27 | 15 | OK |
| 16* | 80 | 27 | 40 | NG |
| 17 | 80 | 27 | 5 | Not bad |
| 18 | 80 | 27 | 0.5 | OK |

Meanwhile, elongation of an encapsulation material used in sample 11 was 1.2% to 1.6%, and coefficient of thermal expansion thereof was 5 ppm/° C. to 7 ppm/° C. Meanwhile, elongation of encapsulation materials used in samples 12 and 16 was 1.0% to 1.2%, and coefficients of thermal expansion thereof was 3 ppm/° C. to 5 ppm/° C. Further, elongation of encapsulation materials used in samples 13 and 17 was 3%, and coefficient of thermal expansion thereof was 40 ppm/° C. Further, elongation of an encapsulation material used in sample 14 was 10%, and coefficient of thermal expansion thereof was 100 ppm/° C. Further, elongation of an encapsulation material used in sample 15 was 10%, and coefficient of thermal expansion thereof was 6 ppm/° C. to 8 ppm/° C. Further, elongation of frames used in samples 11 to 18 was 1.0% to 1.4%, and coefficient of thermal expansion thereof was 10 ppm/° C. to 11 ppm/° C. In addition, modulus of redistribution layers used in samples 11 to 20 was 1.3 GPa.

Meanwhile, in Table 2, samples 11, 12, and 16 in which elastic modulus of an encapsulation material was more than 15 GPa were Comparative Examples, and samples 13 to 15, 17, and 18 in which elastic modulus of an encapsulation material was 15 GPa or less were Experimental Examples prepared according to the present description. Further, "OK" indicates a case in which warpage of 5 mm or less was generated, "Not bad" indicates a case in which warpage of more than 5 mm to less than 8 mm was generated, and "NG" indicates a case in which warpage of 8 mm or more was generated based on a panel.

It may be appreciated that in the Comparative Examples, since elastic modulus of the encapsulation material was large, it was difficult to control warpage of the package, and thus in any case (samples 11, 12, and 16) in which the area ratio was more than 15%, severe warpage of the package was relatively generated. Conversely, it may be appreciated that in the Experimental Examples, since the elastic modulus of the encapsulation material was relatively small, it was easy to control warpage, and thus, in any case (samples 13 to 15, 17, and 18) in which the area ratio was more than 15%, warpage of the package was relatively insignificant.

Experiment 3

Next, cracks generated in corners of a surface of an electronic component covered by an encapsulation material depending on elongation values of a frame and the encapsulation material were measured using the electronic component package according to the example, and the results were illustrated in the following Table 3. Meanwhile, in the electronic component package used in the experiment, a thickness of a frame was 410 μm, a thickness of the electronic component was 405 μm, and a thickness of an encapsulation material covering a back side of the electronic component was 40 μm. A redistribution layer was a single layer, and an effective insulation thickness was 15 μm.

TABLE 3

| No. | Elongation (%) | | Cracks |
|---|---|---|---|
| | Frame | Encapsulation Material | |
| 19* | 1.2 | 1 | NG |
| 20 | 1.4 | 2 | GOOD |
| 21 | 1.2 | 3 | GOOD |
| 22 | 1.4 | 10 | EXCELLENT |

Meanwhile, modulus of an encapsulation material used in sample 19 was 17 GPa and coefficient of thermal expansion thereof was 13 ppm/° C. Further, modulus of an encapsulation material used in sample 20 was 15 GPa and coefficient of thermal expansion thereof was 18 ppm/° C. In addition, modulus of an encapsulation material used in sample 21 was 5 GPa and coefficient of thermal expansion thereof was 40 ppm/° C. Further, modulus of an encapsulation material used in sample 22 was 15 GPa and coefficient of thermal expansion thereof was 6 ppm/° C. to 18 ppm/° C. In addition, modulus of frames used in samples 19 and 21 was 27 GPa and coefficient of thermal expansion thereof was 11 ppm/° C. Further, modulus of frames used in samples 20 and 22 was 30 GPa and coefficient of thermal expansion thereof was 3 ppm/° C. to 5 ppm/° C.

Meanwhile, in Table 3, sample 19 in which elongation of the encapsulation material was less than 1.2% was a Comparative Example, and samples 20 to 22 in which elongation of the encapsulation material was 1.2% or more were Experimental Examples prepared according to the present description. Further, "NG" indicates a case in which there was a reliability issue due to generation of cracks, "GOOD" indicates a case in which cracks were partially generated but there was no reliability issue, and "EXCELLENT" indicates a case in which cracks were rarely found.

It may be appreciated that, in the Comparative Example (sample 19), because elongation of the encapsulation material was small, and thus cracks were generated in corners of a surface of the electronic component covered by the encapsulation material. On the contrary, it may be appreciated that in Experimental Examples (samples 20 to 22), elongation of the encapsulation material was large, and thus, cracks were rarely generated.

Experiment 4

Thereafter, warpage depending on a ratio ($L_1/L_2$) of an effective insulation thickness $L_1$ of a redistribution layer of the electronic component package according to the example and a thickness $L_2$ of the rest portion of the package except for the external layer was measured, and the results were illustrated in the following Table 4. Meanwhile, in the electronic component package used in the experiment, a thickness of a frame was 410 μm, a thickness of the electronic component was 405 μm, and a thickness of an encapsulation material covering a back side of the electronic component was 40 μm. However, the redistribution layer was a single layer or a plurality of layers, and the effective insulation thickness was illustrated in the following Table 4.

TABLE 4

| No. | Thickness (μm) | | Ratio | Warpage (μm) |
|---|---|---|---|---|
| | $L_1$ | $L_2$ | $L_1/L_2$ | |
| 23 | 15 (One Layer) | 445 | 0.03 | OK |
| 24 | 35 (Two Layers) | 445 | 0.08 | OK |

Meanwhile, modulus of frames used in samples 23 and 24 was 27 GPa, elongation thereof was 1.0% to 1.4%, and coefficient of thermal expansion thereof was 10 ppm/° C. to 11 ppm/° C. In addition, modulus of encapsulation materials used in samples 23 to 24 was 5 GPa, elongation thereof was 3%, and coefficient of thermal expansion was 40 ppm/° C. Further, modulus of redistribution layers used in samples 23 to 24 was 1.3 GPa.

Meanwhile, in Table 4, samples 23 and 24 were Experimental Examples in which an effective thickness ratio of the redistribution layer was 0.1 or less. Further, "OK" indicates a case in which warpage of 5 mm or less was generated based on a panel.

It may be appreciated that in the Experimental Examples (samples 23 and 24) in which the effective thickness ratio of the redistribution layer was 0.1 or less, an influence of stress of the redistribution layer was insignificant, and thus, an effect of decreasing warpage was excellent.

As set forth above, according to various embodiments, the electronic component package of which warpage is decreased and the method of efficiently manufacturing an electronic component package may be provided.

Meanwhile, in the present disclosure, a word 'coupled to' includes that one component is not only directly connected to another component, but is also indirectly connected to another component through an adhesive, or the like In addition, a term 'electrically connected' includes both of a case in which one component is physically connected to another component and a case in which any component is not physically connected to another component. In addition, terms "first", "second", and the like, are used to distinguish one component from another component, and do not limit a sequence, importance, and the like, of the corresponding components. In some instances, a first component may be named a second component and a second component may also be similarly named a 'first' component, without departing from the scope of the present disclosure.

Meanwhile, a term 'examples' used in the present disclosure is provided in order emphasize and describe different unique features of various embodiments. However, the above suggested examples may also be implemented to be combined with a feature of another example. For example, even though a content described with respect to an example is not described in another example, it may be understood as a description related to another example unless described to the contrary or contradictory in another example.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component package comprising:
   a frame having a cavity;
   an electronic component disposed in the cavity such that a bottom surface of the electronic component is coplanar with a bottom surface of the frame;
   a redistribution layer disposed adjacent to the bottom surface of the frame and electrically connected to the bottom surface of the electronic component;
   a first conductive pattern layer embedded in a bottom portion of the frame;
   a second conductive pattern layer disposed on an upper surface of the frame;
   a penetration wiring penetrating the frame, electrically connecting to the first conductive pattern layer and the second conductive pattern layer to each other, and having a width less than that of the first conductive pattern layer; and
   an encapsulation material encapsulating the electronic component and having an elastic modulus smaller than that of a material forming the frame,
   wherein the redistribution layer comprises an insulation layer having an elastic modulus smaller than the material forming the frame, and
   the second conductive pattern layer is electrically connected to the bottom surface of the electronic component through the penetrating wiring, the first conductive pattern layer, and the redistribution layer.

2. The electronic component package of claim 1, wherein the cavity penetrates the bottom surface of the frame and the upper surface of the frame opposing the bottom surface.

3. The electronic component package of claim 1, wherein an area ratio ($S_a/S_r*100$) occupied by the electronic component is more than 15%, in which an entire area of the electronic component package is defined as $S_r$, and an area of the electronic component is defined as $S_a$, in the same plane.

4. The electronic component package of claim 3, wherein the elastic modulus of the encapsulation material is 15 GPa or less.

5. The electronic component package of claim 3, wherein the elastic modulus of the material forming the frame is 20 GPa or more.

6. The electronic component package of claim 1, wherein the number of electronic components is plural, and
   the plurality of electronic components are disposed in the cavity of the frame.

7. The electronic component package of claim 1, wherein the number of cavities of the frame is plural,
   and electronic components are disposed in the plurality of cavities of the frame, respectively.

8. The electronic component package of claim 6, wherein at least one of the plurality of the electronic components is an integrated circuit chip.

9. The electronic component package of claim 1, wherein an effective insulation thickness of the redistribution layer is defined as $L_1$ and a thickness from a lower surface of the electronic component to an outer surface of the encapsulation material in the same cross section is defined as $L_2$ so that $L_1/L_2$ satisfies $L_1/L_2 \leq 1/10$.

10. The electronic component package of claim 1, wherein the encapsulation material fills a space between the frame and the electronic component in the cavity and covers the electronic component.

11. The electronic component package of claim 1, wherein an elongation of the encapsulation material is 1.2% or more.

12. The electronic component package of claim 1, further comprising:
    an external layer connected to the redistribution layer and having first openings; and
    first external connection terminals disposed in the first openings and exposed externally,
    wherein at least one of the first external connection terminals is disposed in a fan-out region.

13. The electronic component package of claim 1, wherein the encapsulation material is disposed adjacent to an upper surface of the frame and an upper surface of the electronic component.

14. The electronic component package of claim 1, wherein the elastic modulus of the insulation layer of the redistribution layer is smaller than the elastic modulus of the encapsulation layer.

15. The electronic component package of claim 1, further comprising a metal layer disposed on at least one of the bottom and upper surfaces of the frame and an inner surface of the cavity.

16. The electronic component package of claim 1,
    wherein the bottom surface of the frame is in contact with the insulation layer of the redistribution layer,
    wherein a bottom surface of the first conductive pattern layer is in contact with the insulation layer of the redistribution layer, and
    wherein the bottom surface of the first conductive pattern layer, the bottom surface of the frame, and an upper surface of the insulation layer of the redistribution layer are coplanar with each other.

17. A method of manufacturing an electronic component package, the method comprising:
    preparing a frame having a cavity;
    forming a first conductive pattern layer embedded in a bottom portion of the frame, a second conductive pattern layer disposed on an upper surface of the frame, and a penetration wiring penetrating the frame, electrically connecting to the first conductive pattern layer and the second conductive pattern layer to each other, and having a width less than that of the first conductive pattern layer;
    disposing an electronic component in the cavity such that a bottom surface of the electronic component is coplanar with a bottom surface of the frame opposing the upper surface of the frame;
    encapsulating the electronic component using an encapsulation material having an elastic modulus smaller than that of a material forming the frame, the encapsulation material being adjacent to the upper surface of the frame; and
    forming a redistribution layer electrically connected to the bottom surface of the electronic component to be directly adjacent to the bottom surface of the frame, such that the second conductive pattern layer is electrically connected to the bottom surface of the electronic component through the penetrating wiring, the first conductive pattern layer, and the redistribution layer.

18. The method of claim 17, further comprising:
removing an adhesive layer used to support the frame and the electronic component during the encapsulating of the electronic component prior to the forming of the redistribution layer.

19. The method of claim 17, the disposing of the electronic component in the cavity comprises positioning the frame and the electronic component on an adhesive layer.

20. An electronic component package comprising:
an electronic component;
a redistribution layer including an insulation layer and a conducive layer; and
a frame disposed directly on the insulation layer of the redistribution layer, and comprising an insulating material having an elastic modulus larger than an elastic modulus of the insulation layer of the redistribution layer;
a conductive pattern layer embedded in the frame; and
an encapsulation material covering the electronic component, an elastic modulus of the encapsulation material being smaller than the elastic modulus of the insulating material of the frame,
wherein a bottom surface of the conductive pattern layer, a bottom surface of the frame, and an upper surface of the insulation layer of the redistribution layer are coplanar with each other.

21. The electronic component package of claim 20, wherein the elastic modulus of the encapsulation material is approximately 50 MPa or greater and approximately 15 GPa or less, and the elastic modulus of the insulating material of the frame is approximately 20 GPa or greater.

22. The electronic component package of claim 20, wherein the elastic modulus of the insulation layer of the redistribution layer is smaller than the elastic modulus of the encapsulation layer.

* * * * *